United States Patent
Matsuo

(10) Patent No.: US 10,491,842 B2
(45) Date of Patent: Nov. 26, 2019

(54) IMAGING DEVICE, A SOLID-STATE IMAGING DEVICE FOR USE IN THE IMAGING DEVICE

(71) Applicant: Panasonic Intellectual Property Management Co., Ltd., Osaka (JP)

(72) Inventor: Junichi Matsuo, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 227 days.

(21) Appl. No.: 15/423,927

(22) Filed: Feb. 3, 2017

(65) Prior Publication Data

US 2017/0150077 A1 May 25, 2017

Related U.S. Application Data

(63) Continuation of application No. PCT/JP2015/004066, filed on Aug. 17, 2015.

(30) Foreign Application Priority Data

Aug. 29, 2014 (JP) .................................. 2014-174885

(51) Int. Cl.
*H04N 5/361* (2011.01)
*H04N 5/347* (2011.01)
(Continued)

(52) U.S. Cl.
CPC ....... *H04N 5/361* (2013.01); *H01L 27/14843* (2013.01); *H04N 5/2256* (2013.01);
(Continued)

(58) Field of Classification Search
CPC .... H04N 5/361; H04N 5/2256; H04N 5/2351; H04N 5/33; H04N 5/347; H04N 5/372; H04N 5/3728; H01L 27/14842
(Continued)

(56) References Cited

U.S. PATENT DOCUMENTS

| | | | | |
|---|---|---|---|---|
| 6,760,069 B2* | 7/2004 | Yanai | ..................... | H04N 9/045 348/222.1 |
| 7,333,139 B2* | 2/2008 | Okamoto | ............... | H04N 9/045 348/222.1 |
| 7,898,586 B2* | 3/2011 | Kashiwagi | ........... | H04N 5/3452 348/303 |
| 8,139,116 B2* | 3/2012 | Murayama | ........ | H01L 27/14837 348/135 |

(Continued)

FOREIGN PATENT DOCUMENTS

WO 2014/002415 1/2014

OTHER PUBLICATIONS

International Search Report of PCT application No. PCT/JP2015/004066 dated Oct. 27, 2015.

*Primary Examiner* — Mohammed S Rahaman
*Assistant Examiner* — Jimmy S Lee
(74) *Attorney, Agent, or Firm* — McDermott Will & Emery LLP

(57) ABSTRACT

Each of pixels disposed in a matrix form on a substrate includes a photoelectric conversion unit that converts incident light into a signal charge, a reading electrode that reads the signal charge from the photoelectric conversion unit, and a vertical transfer electrode that constitutes a vertical transfer unit. A plurality of first pixels, and a plurality of second pixels disposed adjacent to the first pixels are alternately disposed for each row, and also alternately disposed for each column to form a checkered pattern. The reading electrode of each of the pixels is disposed such that a plurality of signal charges read from the identical photoelectric conversion unit contain a dark current generated under the common reading electrode.

10 Claims, 37 Drawing Sheets

(51) Int. Cl.
  *H04N 5/3728*  (2011.01)
  *H04N 5/225*   (2006.01)
  *H04N 5/235*   (2006.01)
  *H04N 5/33*    (2006.01)
  *H04N 5/372*   (2011.01)
  *H01L 27/148*  (2006.01)

(52) U.S. Cl.
  CPC ............ *H04N 5/2351* (2013.01); *H04N 5/33* (2013.01); *H04N 5/347* (2013.01); *H04N 5/372* (2013.01); *H04N 5/3728* (2013.01)

(58) Field of Classification Search
  USPC ........................................................ 348/164
  See application file for complete search history.

(56) References Cited

U.S. PATENT DOCUMENTS

| | | | | |
|---|---|---|---|---|
| 8,279,316 B2 * | 10/2012 | Border | ............... | H04N 5/35554 |
| | | | | 348/311 |
| 8,294,800 B2 * | 10/2012 | Harada | ............. | H01L 27/14812 |
| | | | | 348/311 |
| 8,553,138 B2 * | 10/2013 | Makii | ................ | H04N 5/23245 |
| | | | | 348/224.1 |
| 8,570,421 B2 * | 10/2013 | Okada | ................... | H04N 5/347 |
| | | | | 250/208.1 |
| 8,582,009 B2 * | 11/2013 | Kono | ............... | H01L 27/14609 |
| | | | | 348/281 |
| 8,803,976 B2 * | 8/2014 | Kabasawa | ........... | H04N 5/3532 |
| | | | | 348/164 |
| 2012/0229669 A1 * | 9/2012 | Okada | ................... | H04N 5/347 |
| | | | | 348/222.1 |
| 2015/0092019 A1 | 4/2015 | Asano et al. | | |

* cited by examiner

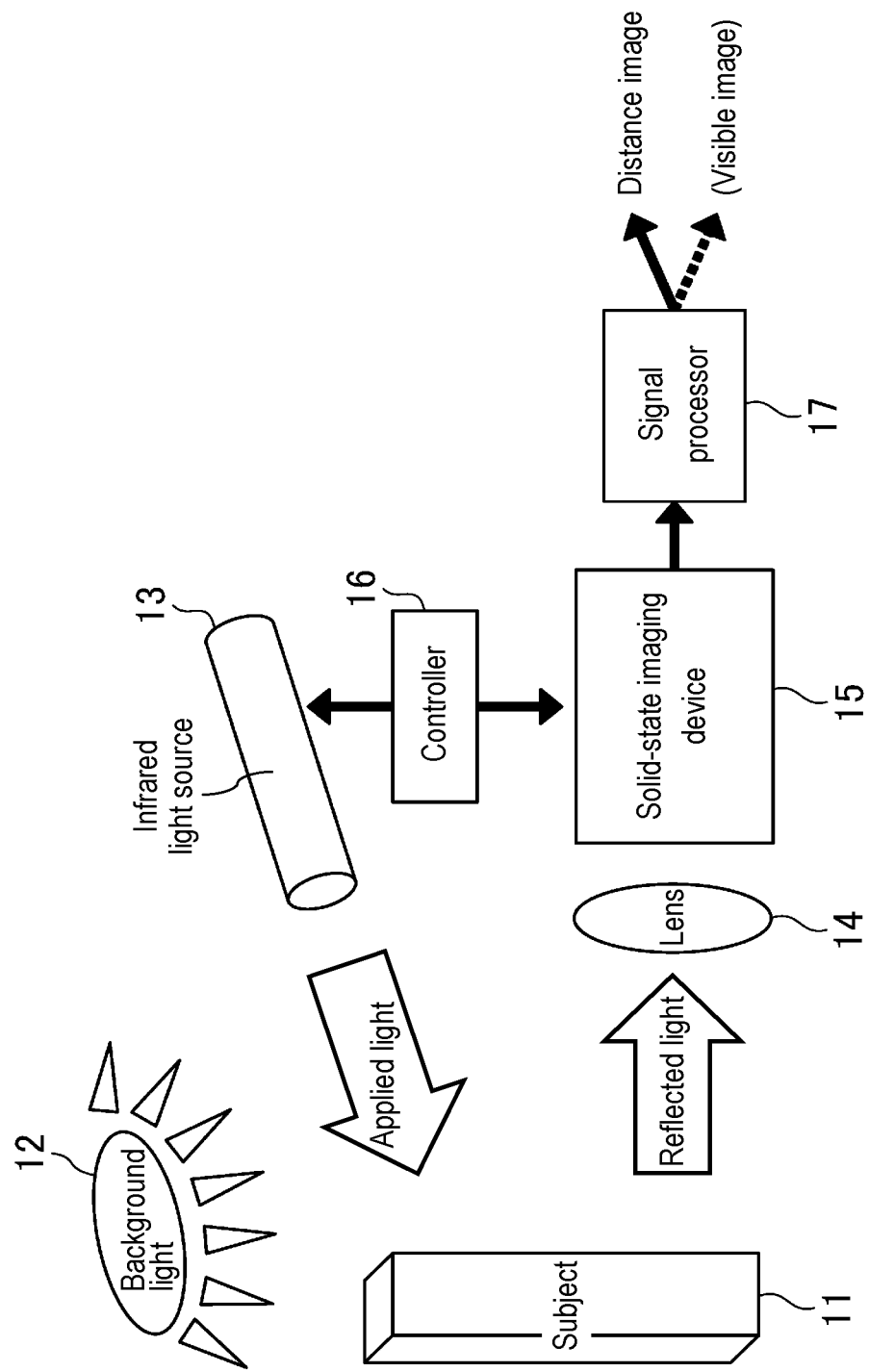

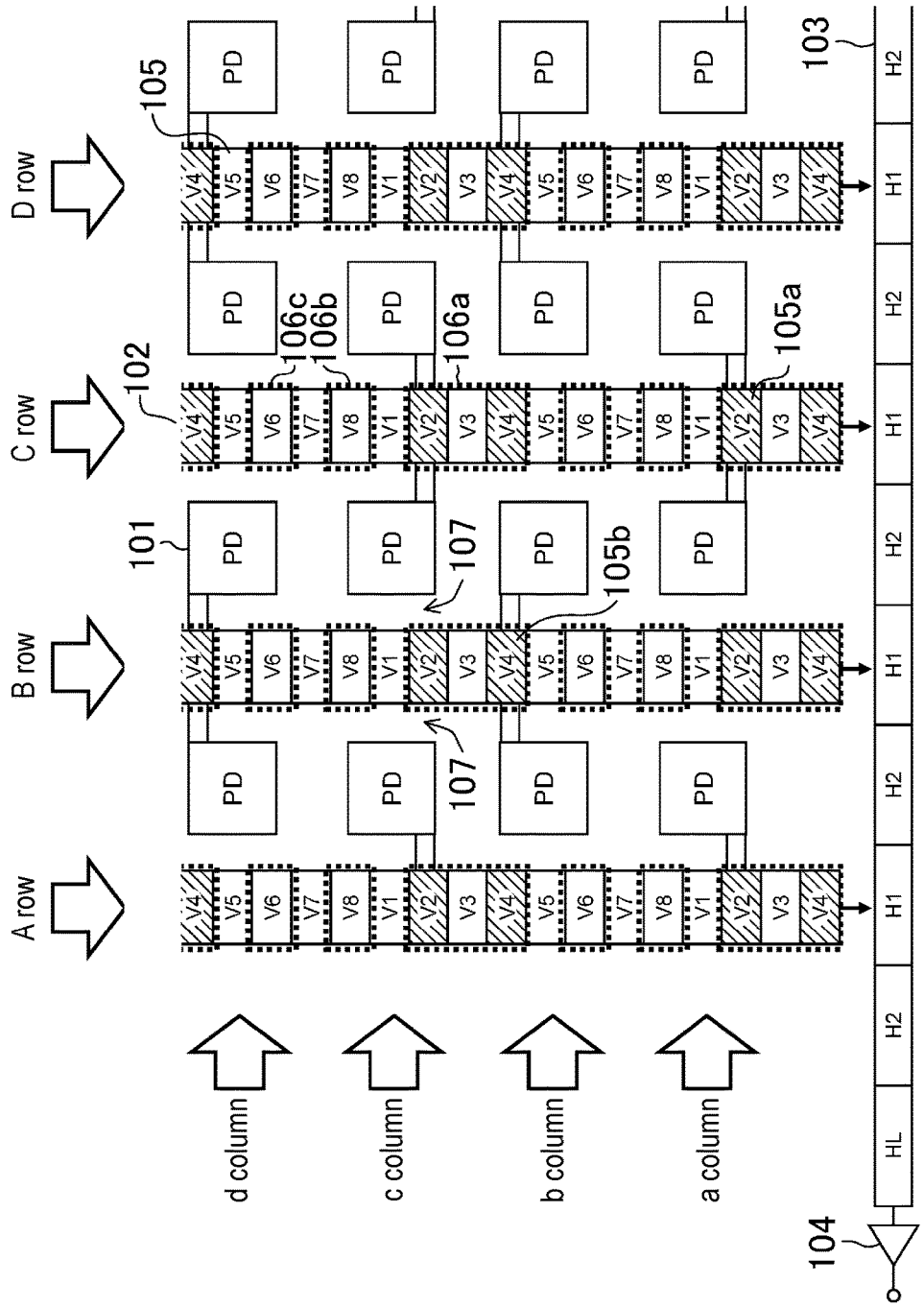

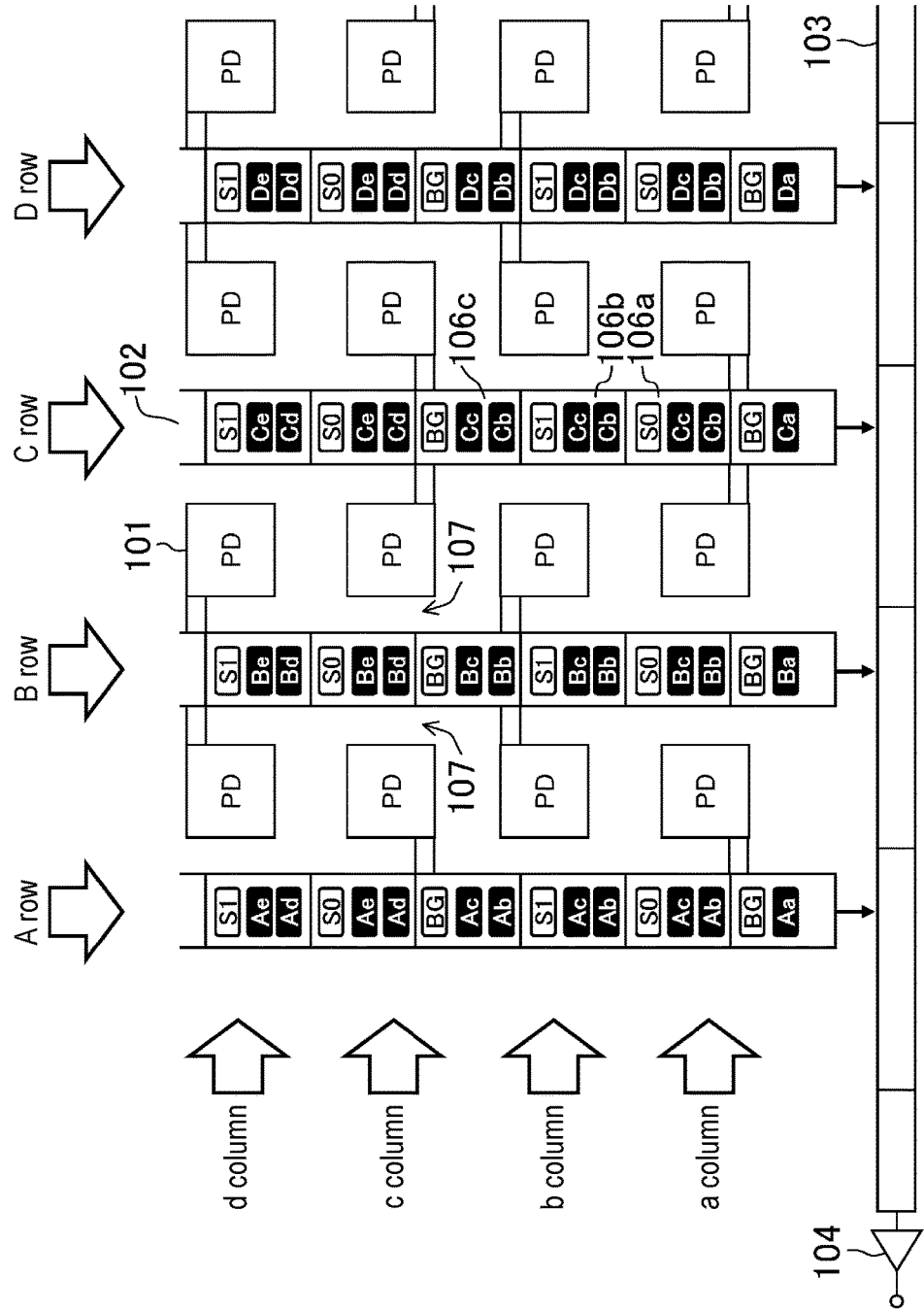

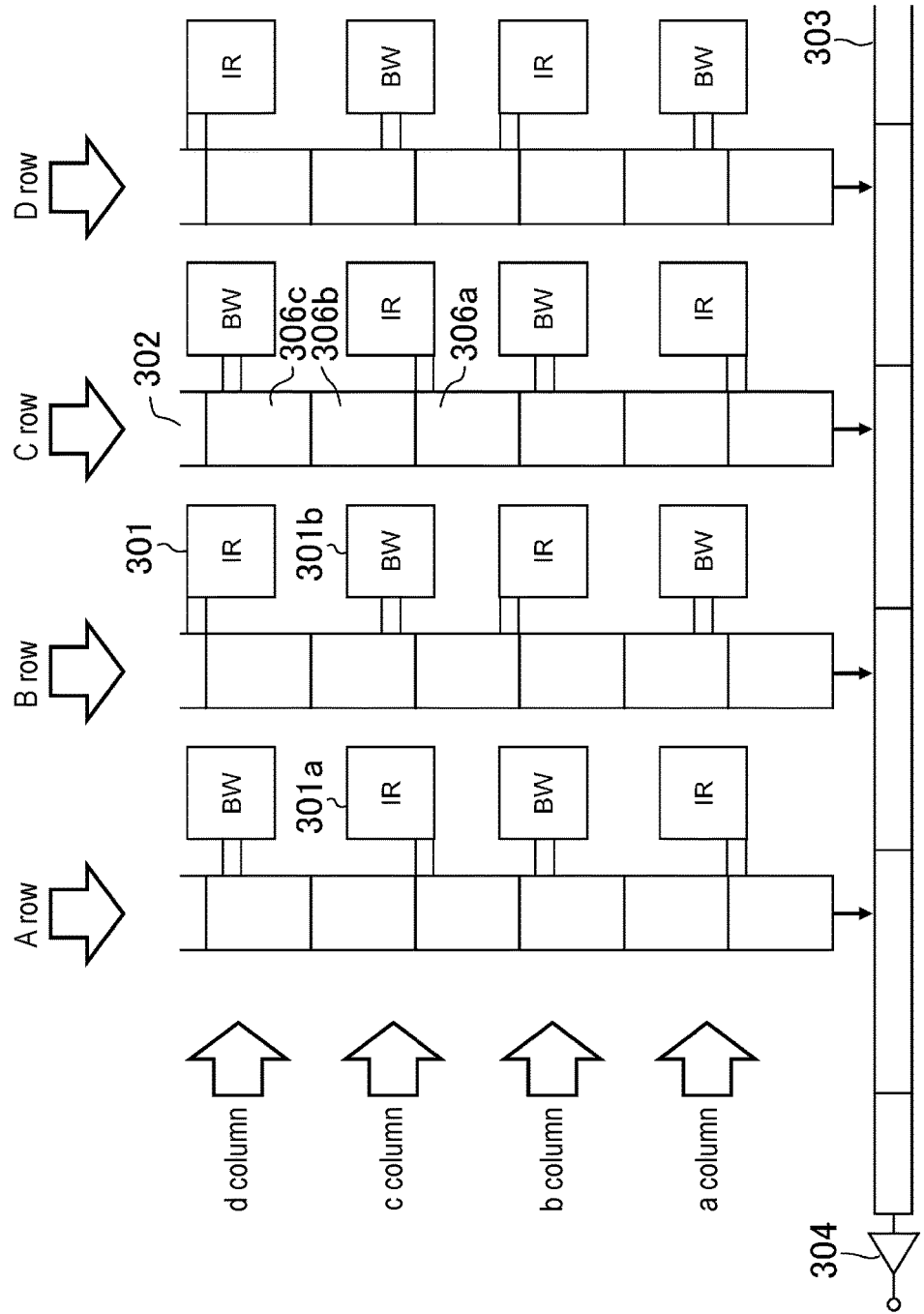

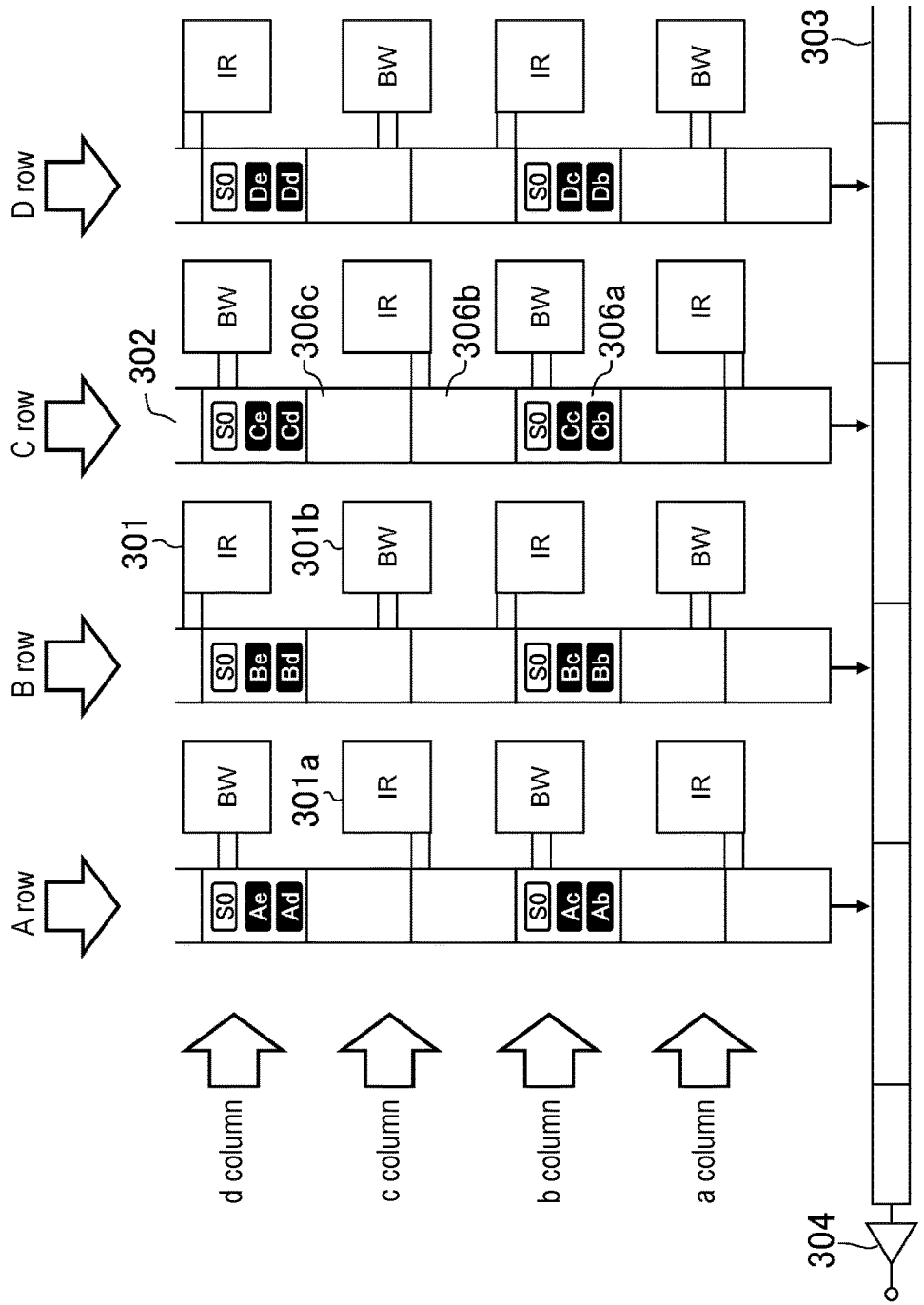

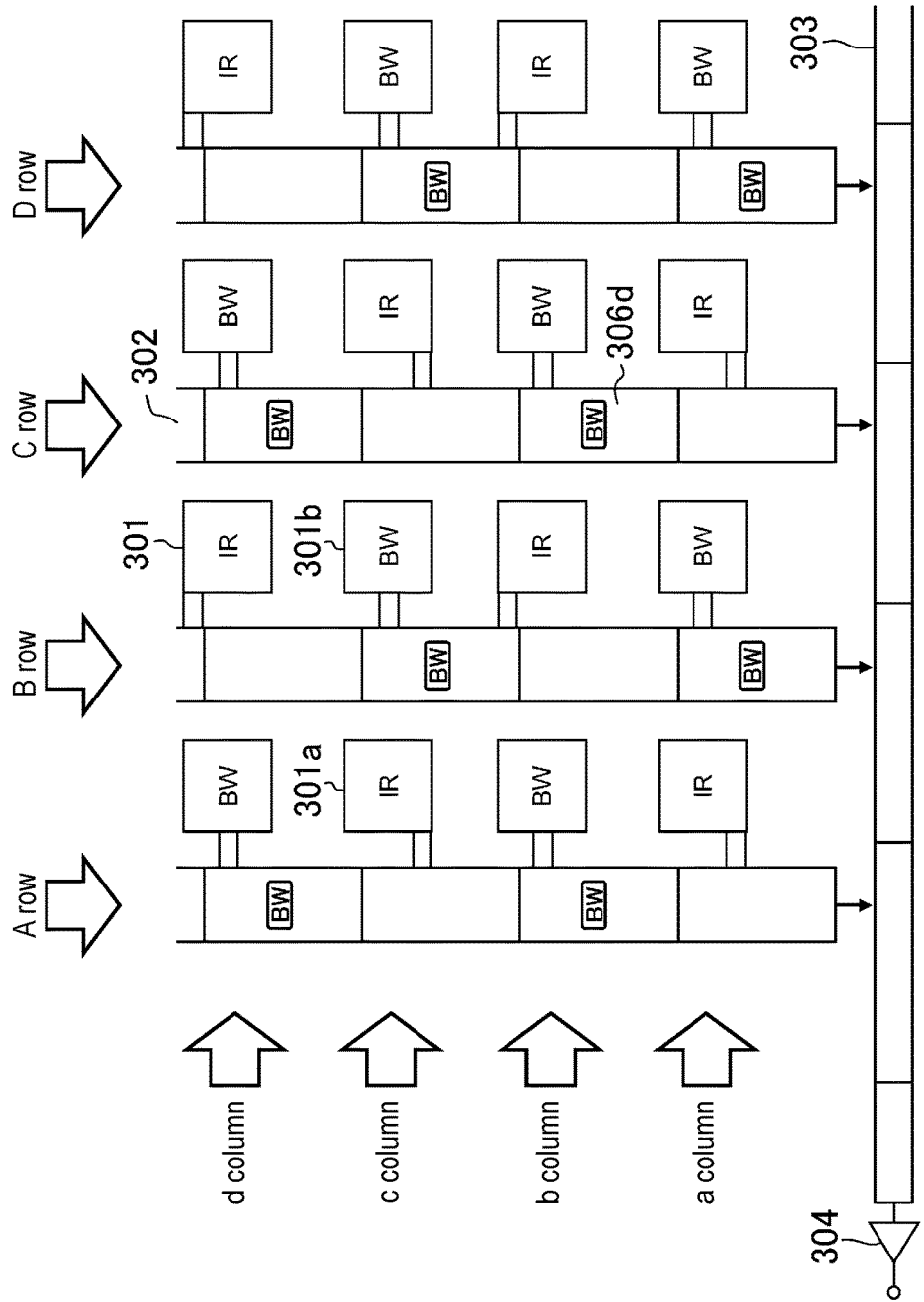

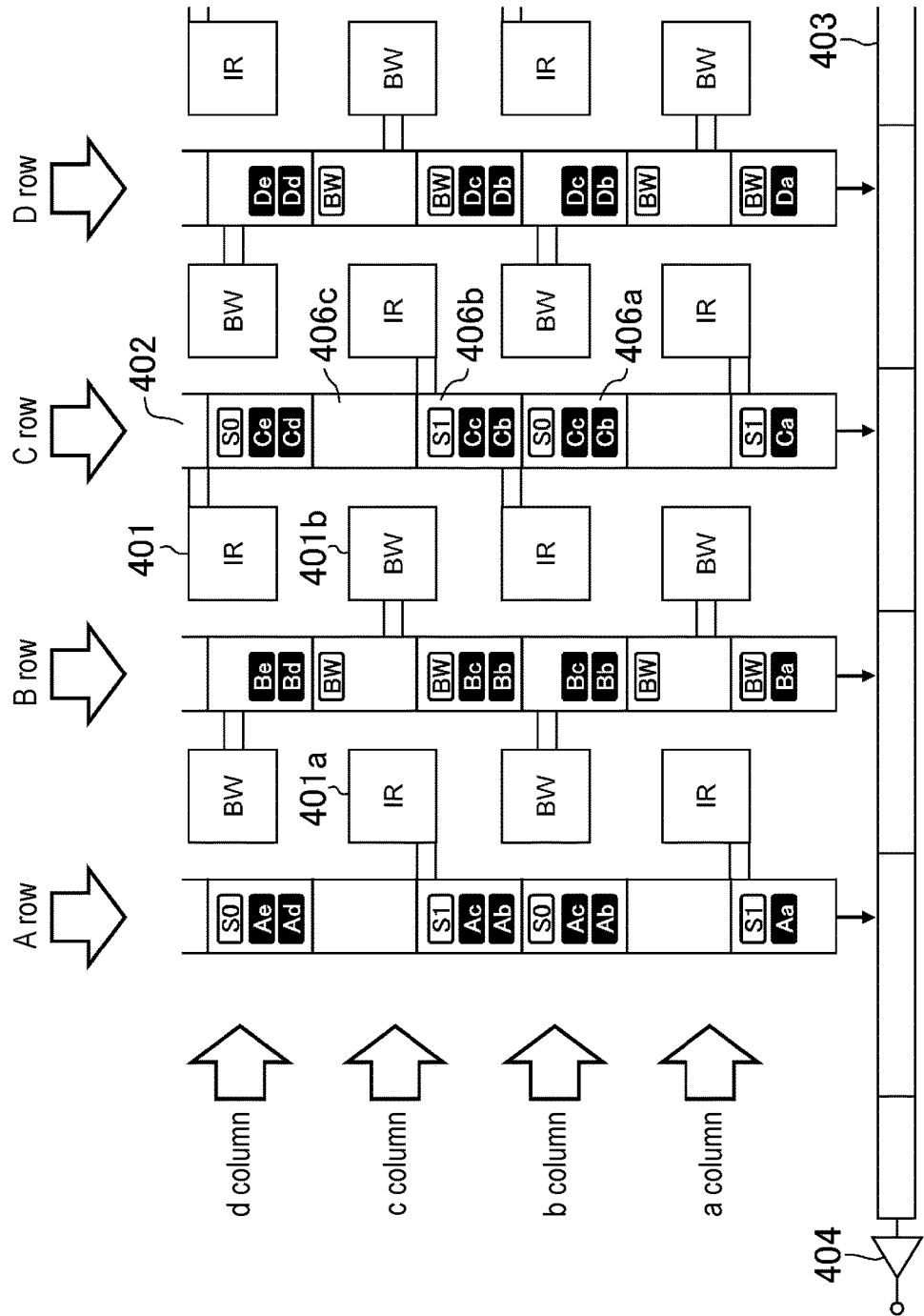

IMAGING DEVICE, A SOLID-STATE IMAGING DEVICE FOR USE IN THE IMAGING DEVICE

TECHNICAL FIELD

The present disclosure relates to an imaging device which captures an image of a subject present at a predetermined distance (distance image).

BACKGROUND ART

It is known in recent years to provide on a smartphone, a game machine or the like, a solid-state imaging device, i.e., a so-called distance measuring sensor provided with a distance measuring camera which applies infrared light to an imaging target space, for example, and detects movement of a body or a hand of a subject (human) to capture a distance image used by the smartphone, game machine or the like (for example, see PTL 1).

A solid-state imaging device described in PTL 1 reads signal charges from photoelectric conversion units of adjoining two pixels, and adds the signal charges on a vertical transfer unit to produce three packets (memory cells) for every two pixels. This solid-state imaging device uses a time of flight method (TOF method) as an operation principle of a distance measuring camera. The solid-state imaging device emits pulsed infrared light, and receives reflected light of the infrared light from a subject in two types of exposure periods to read two-types of signal charges S0 and S1 from photoelectric conversion units and accumulate read signal charges S0 and S1 in corresponding packets. In addition, the solid-state imaging device receives background light without emitting infrared light to read signal charge BG and accumulate the signal charge BG in a packet. The signal charges accumulated in the respective packets are sequentially transferred and output to calculate a distance to the subject for each pixel based on ratios and differences between signal charges S0, S1, and BG, and form a distance image based on the calculated distance.

Moreover, according to PTL 1, pixels are disposed in a checkered pattern to improve horizontal and vertical resolutions of the distance image.

CITATION LIST

Patent Literature

PTL 1: WO 2014/002415

SUMMARY OF THE INVENTION

An aspect of the present disclosure is directed to an imaging device which includes an infrared light source for applying infrared light to a subject, and a solid-state imaging device that includes pixels disposed in a matrix formed on a substrate and receives incident light from the subject. Each of the pixels includes a photoelectric conversion unit that converts the incident light into a signal charge, a reading electrode that reads the signal charge from the photoelectric conversion unit, and at least one vertical transfer electrode that constitutes a vertical transfer unit. A plurality of first pixels, and a plurality of second pixels disposed adjacent to the first pixels are included in the pixels, and alternately disposed for each row, and also alternately disposed for each column to form a checkered pattern. The reading electrode of each of the pixels is disposed such that a plurality of signal charges read from the identical photoelectric conversion unit contain a dark current generated under the common reading electrode.

According to this aspect, the first and second pixels are disposed in a checkered pattern. The reading electrode of each of the pixels is disposed such that a plurality of signal charges read from the identical photoelectric conversion unit contain a dark current generated under the common reading electrode. In this case, dark currents contained in a plurality of signal charges read from one pixel are generated from the same source, in which condition signal levels of the dark currents become uniform. Accordingly, horizontal and vertical resolutions improve without lowering measure distance accuracy.

Provided according to the present disclosure is an imaging device capable of reducing variations of distance measurement results, and improving distance measurement accuracy.

BRIEF DESCRIPTION OF DRAWINGS

FIG. 7 is a schematic configuration diagram of a distance measuring camera including a solid-state imaging device.

FIG. 8 is a plan view illustrating a configuration of a solid-state imaging device according to a first exemplary embodiment.

FIG. 9F is a plan view illustrating an operation of the solid-state imaging device illustrated in FIG. 8.

FIG. 12A is a plan view illustrating an operation of the solid-state imaging device illustrated in FIG. 11.

FIG. 12C is a plan view illustrating an operation of the solid-state imaging device illustrated in FIG. 11.

FIG. 12H is a plan view illustrating an operation of the solid-state imaging device illustrated in FIG. 11.

FIG. 14E is a plan view illustrating an operation of the solid-state imaging device illustrated in FIG. 13.

DESCRIPTION OF EMBODIMENTS

Problems arising from conventional imaging devices are hereinafter briefly touched upon prior to description of exemplary embodiments of the present invention.

The imaging device disclosed in PTL 1 achieves high image quality and high accuracy, and also reduces power and heat generation of an entire system.

However, when a solid-state imaging device reads signal charges from photoelectric conversion units into vertical transfer units, dark currents may be generated by the reading.

According to the structure of PTL 1 which positions pixels in a checkered pattern, dark currents contained in signal charges S0 and S1 and dark currents contained in signal charge BG are generated from different sources at the time of reading. In this case, a signal level of the dark currents of signal charges S0 and S1 becomes different from a signal level of the dark current of signal charge BG. A distance measuring sensor is configured to cancel an effect of background light based on a difference calculated between signal charges S0 and S1 and signal charge BG. When the signal level of the dark currents contained in signal charges S0 and S1 is different from the signal level of the dark currents contained in signal charge BG, cancellation of dark current components becomes impossible. In this case, variations may be produced in distance measurement results, in which condition distance measurement accuracy may lower.

The present disclosure has been developed in consideration of the aforementioned problems. An object of the present disclosure is to provide an imaging device capable of reducing variations of distance measurement results, and improving distance measurement accuracy.

(Findings on which the Present Disclosure is Based)

Findings on which the present disclosure is based are hereinafter described before discussion of exemplary embodiments of the present disclosure.

Figure 1:
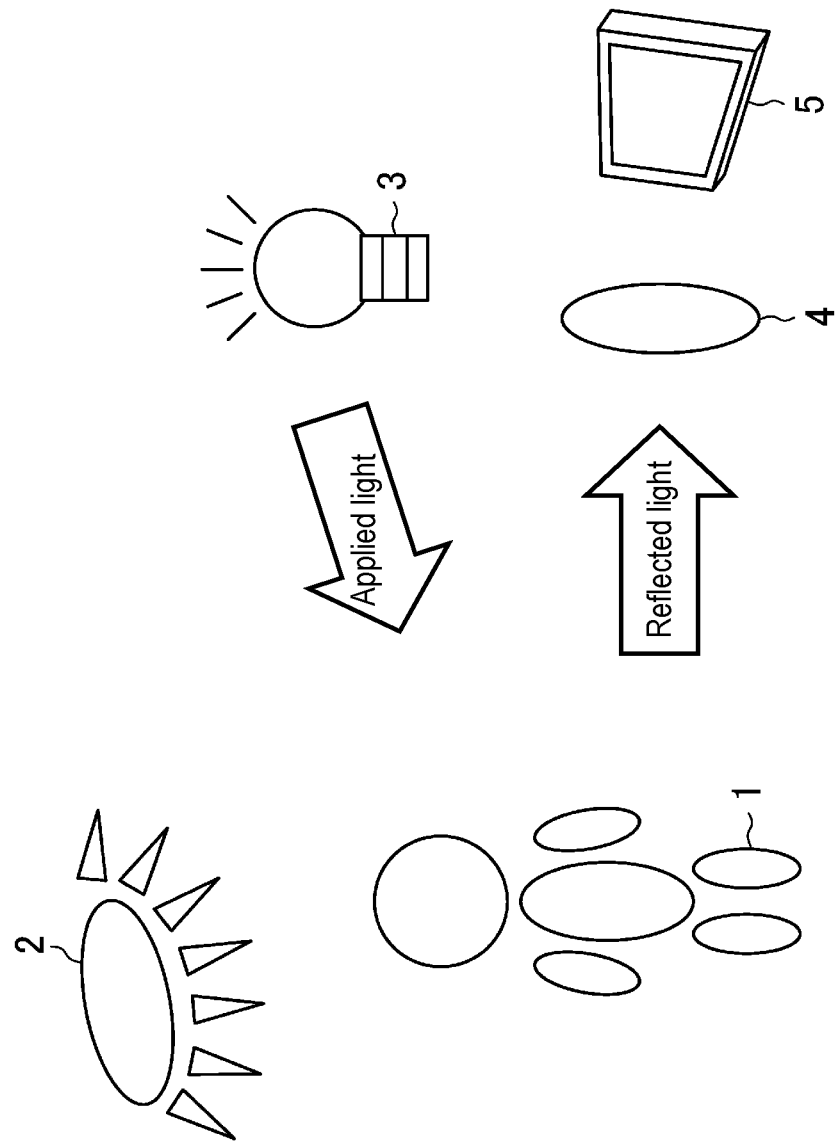
FIG. 1 is a schematic configuration diagram of an ordinary distance measuring camera using a TOF method.

FIG. 1 is a schematic configuration diagram of an ordinary distance measuring camera operated by the TOF method. As illustrated in FIG. 1, infrared light is applied from infrared light source 3 to subject 1 under background light source 2. Solid-state imaging device 5 receives reflected light of the infrared light via optical lens 4. An image formed on solid-state imaging device 5 is converted into an electric signal.

Figure 2:
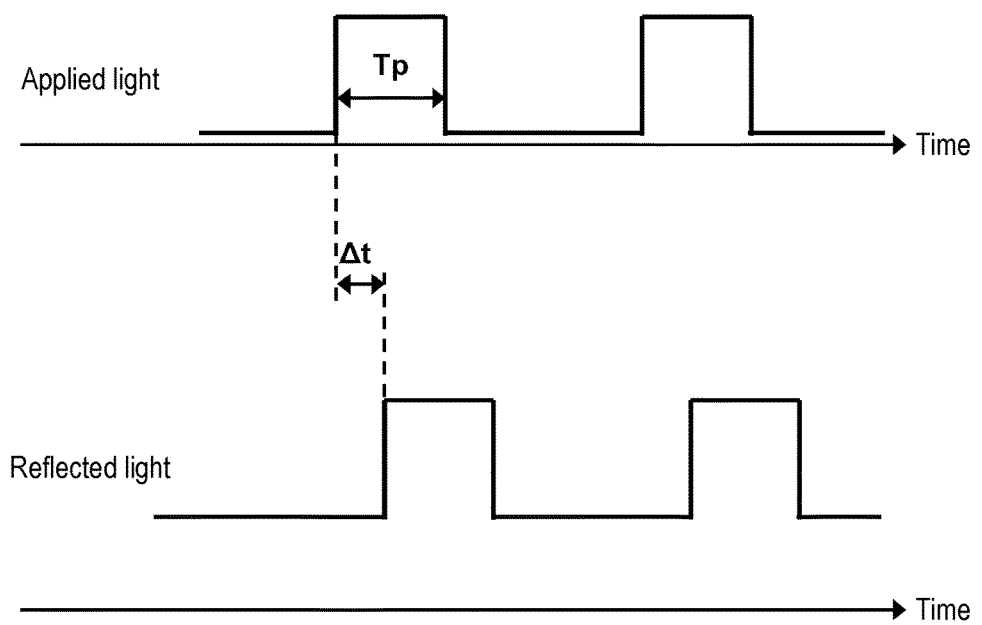
FIG. 2 is a first timing chart showing a general operation of the distance measuring camera illustrated in FIG. 1.

FIG. 2 is a timing chart showing a general operation of the distance measuring camera. Applied light having pulse width Tp is reflected by the subject. Reflected light of the applied light is input to the solid-state imaging device with delay Δt. A distance to the subject is calculated based on measurement of delay Δt.

Figure 3:
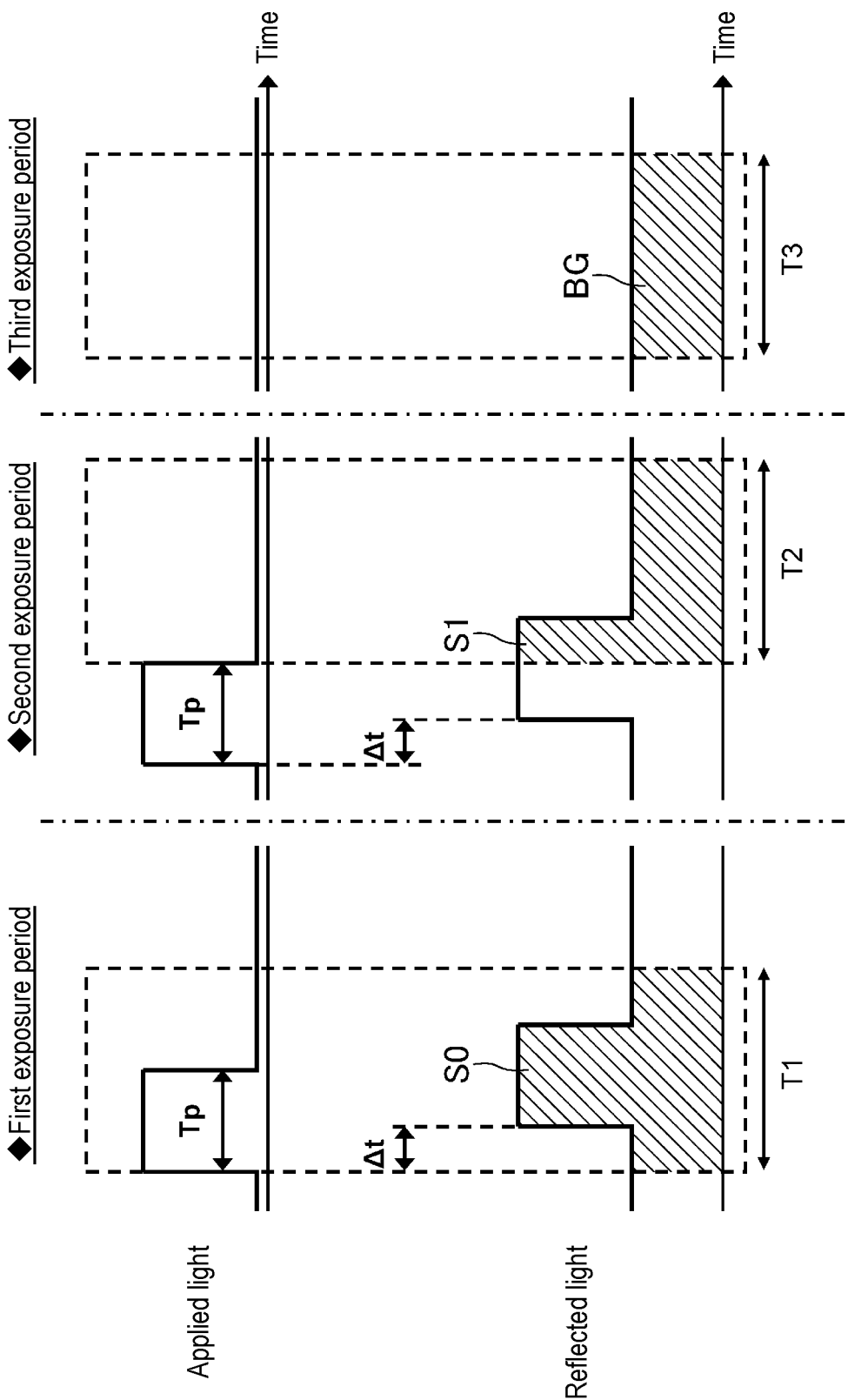
FIG. 3 is a view illustrating an operation principle of the TOF method based on the timing chart shown in FIG. 2.

FIG. 3 is a view illustrating an example of an operation principle of the distance measuring camera using the TOF method corresponding to the timing chart in FIG. 2. It is assumed that a first exposure period starting from a rise time of the applied light having pulse width Tp is T1, that a second exposure period starting from a fall time of the applied light is T2, and that a third exposure period in an off-state of the infrared light source is T3 as illustrated in FIG. 3. Each of exposure periods T1 to T3 is set to a period longer than pulse width Tp. Assuming that a signal quantity (signal charge quantity) obtained by the camera during first exposure period T1 is S0, that a signal quantity (signal charge quantity) obtained by the camera during second exposure period T2 is S1, and that a signal quantity (signal charge quantity) obtained by the camera during third exposure period T3 is BG, delay Δt is calculated by a following equation.

$$\Delta t = Tp\{(S1-BG)/(S0-BG)\}$$

Figure 4:
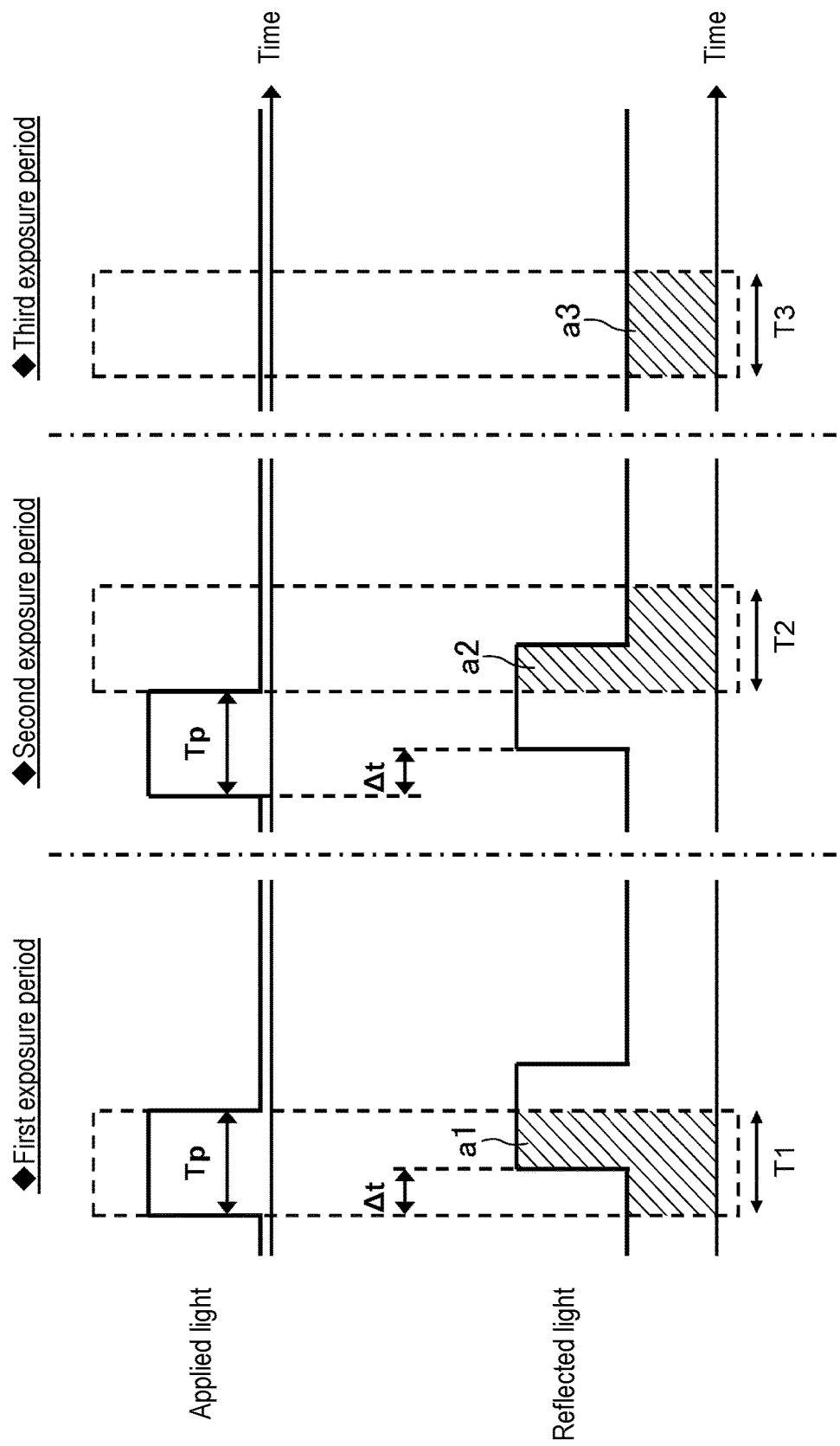
FIG. 4 is a view illustrating an operation principle of the TOF method based on the timing chart shown in FIG. 2.

FIG. 4 is a view illustrating another example of the operation principle of the distance measuring camera using the TOF method corresponding to the timing chart in FIG. 2. It is assumed that a first exposure period starting from a rise time of the applied light having pulse width Tp is T1, that a second exposure period starting from a fall time of the applied light is T2, and that a third exposure period in an off-state of the near-infrared light source is T3 as illustrated in FIG. 4. Each of exposure periods T1 to T3 is set to a period equivalent to pulse width Tp. Assuming that a signal quantity (signal charge quantity) obtained by the camera during first exposure period T1 is S0, that a signal quantity (signal charge quantity) obtained by the camera during second exposure period T2 is S1, and that a signal quantity (signal charge quantity) obtained by the camera during third exposure period T3 is BG, delay Δt is calculated by a following equation.

$$\Delta t = Tp\{(S1-BG)/(S0+S1-2\times BG)\}$$

It is needed that a solid-state imaging element included in each of these distance measuring cameras using the TOF method is an element capable of performing sampling a plurality of times for one cycle of applied light.

Figure 5:
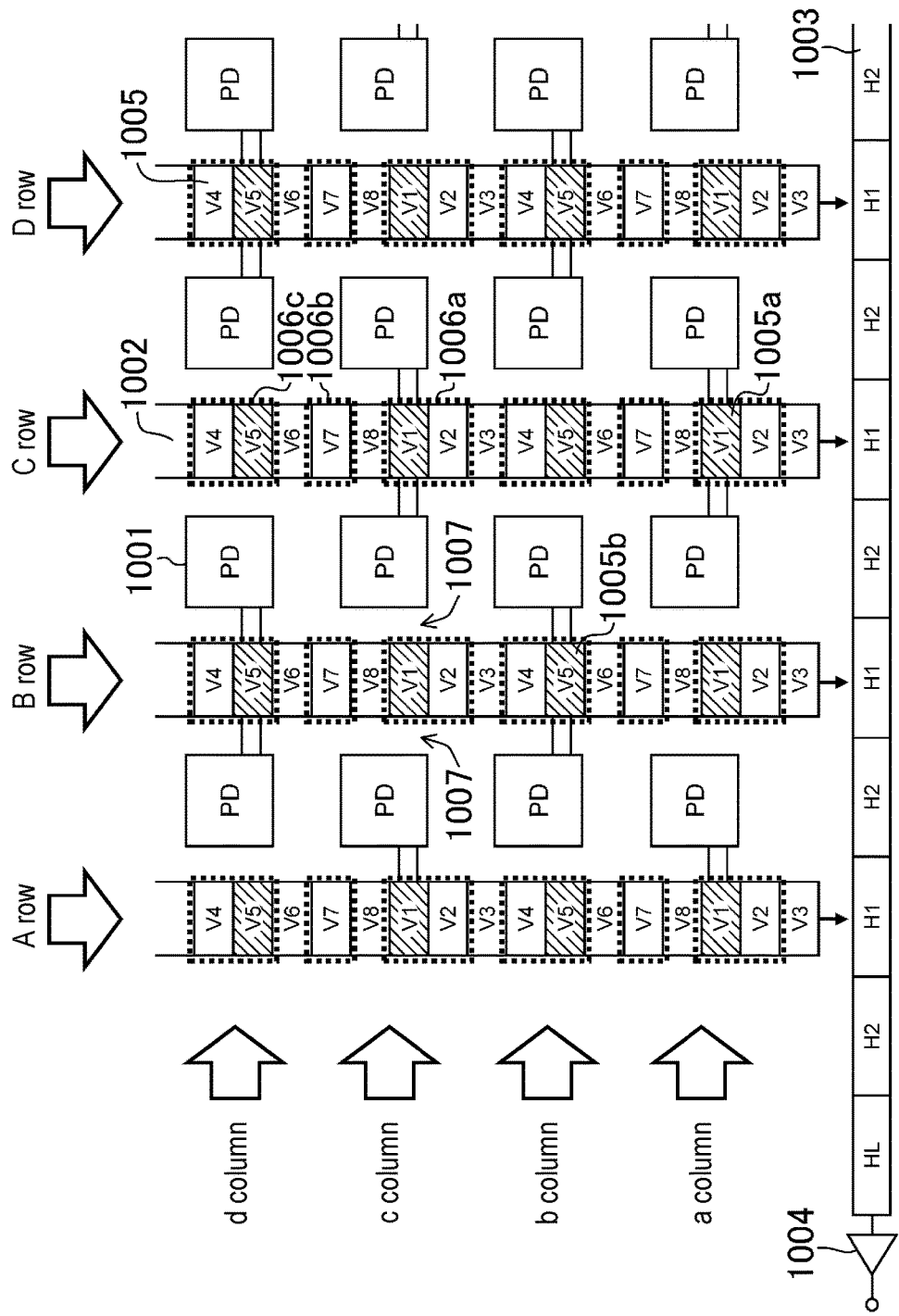
FIG. 5 is a plan view illustrating a structure of a solid-state imaging device according to PTL 1.

The solid-state imaging device disclosed in PTL 1 has a structure illustrated in FIG. 5. The solid-state imaging device of PTL 1 includes a plurality of photoelectric conversion units 1001 disposed in a matrix form on a semiconductor substrate and converting incident light into signal charges, vertical transfer units 1002 provided in correspondence with photoelectric conversion units 1001 and transferring signal charges read from photoelectric conversion units 1001 in a column direction (vertical direction), horizontal transfer unit 1003 transferring signal charges received from vertical transfer units 1002 in a row direction (horizontal direction), and charge detector 1004 outputting signal charges received from horizontal transfer unit 1003. The solid-state imaging device further includes first reading electrodes 1005a and second reading electrodes 1005b. First reading electrode 1005a or second reading electrode 1005b is provided for each of photoelectric conversion units 1001 to read signal charges from photoelectric conversion units 1001 into vertical transfer units 1002 for each row. Positions of reading electrodes 1005a, 1005b are hatched in FIG. 5.

The solid-state imaging device herein is constituted of a charge-coupled device (CCD) image sensor. For example, each of vertical transfer units 1002 is an eight-phase driving unit having eight gates of vertical transfer electrodes 1005 per two pixels, and contains three packets 1006a to 1006c per two photoelectric conversion units 1001. Horizontal transfer unit 1003 is a two-phase driving unit. Vertical transfer electrodes 1005a and 1005b of eight-phase driving vertical transfer units 1002 are configured to function as reading electrodes as well for reading signal charges from photoelectric conversion units 1001. Signal charges accumulated in the photoelectric conversion units are read by electrodes such as packet 1006a.

In addition, first reading electrodes 1005a and second reading electrodes 1005b have a structure which simultaneously achieves reading from each of photoelectric conversion units 1001 adjacent to each other in the horizontal direction with corresponding vertical transfer unit 1002 interposed between adjoining photoelectric conversion units 1001, and adds the readings. In this case, the pixels to be added are located at positions shifted by one pixel for each column such that respective centers of gravity of the added pixels are located in a checkered pattern after addition.

First reading electrodes 1005a and second reading electrodes 1005b are disposed in all rows. In this case, positions where reading from photoelectric conversion units 1001 on both sides is prohibited, and positions where reading from photoelectric conversion units 1001 on both sides is allowed are present in a checkered pattern as illustrated in FIG. 5. Accordingly, channel stop areas 1007 are formed on both sides of first reading electrodes 1005a and second reading electrodes 1005b from which signal charges are not read to prohibit reading of the signal charges into vertical transfer units 1002 when a reading pulse is applied to first reading electrodes 1005a and second reading electrodes 1005b. On the other hand, channel stop areas 1007 are provided on neither sides of first reading electrodes 1005a and second reading electrodes 1005b from which signal charges need to be read to allow easy reading of the signal charges.

Figure 6A:
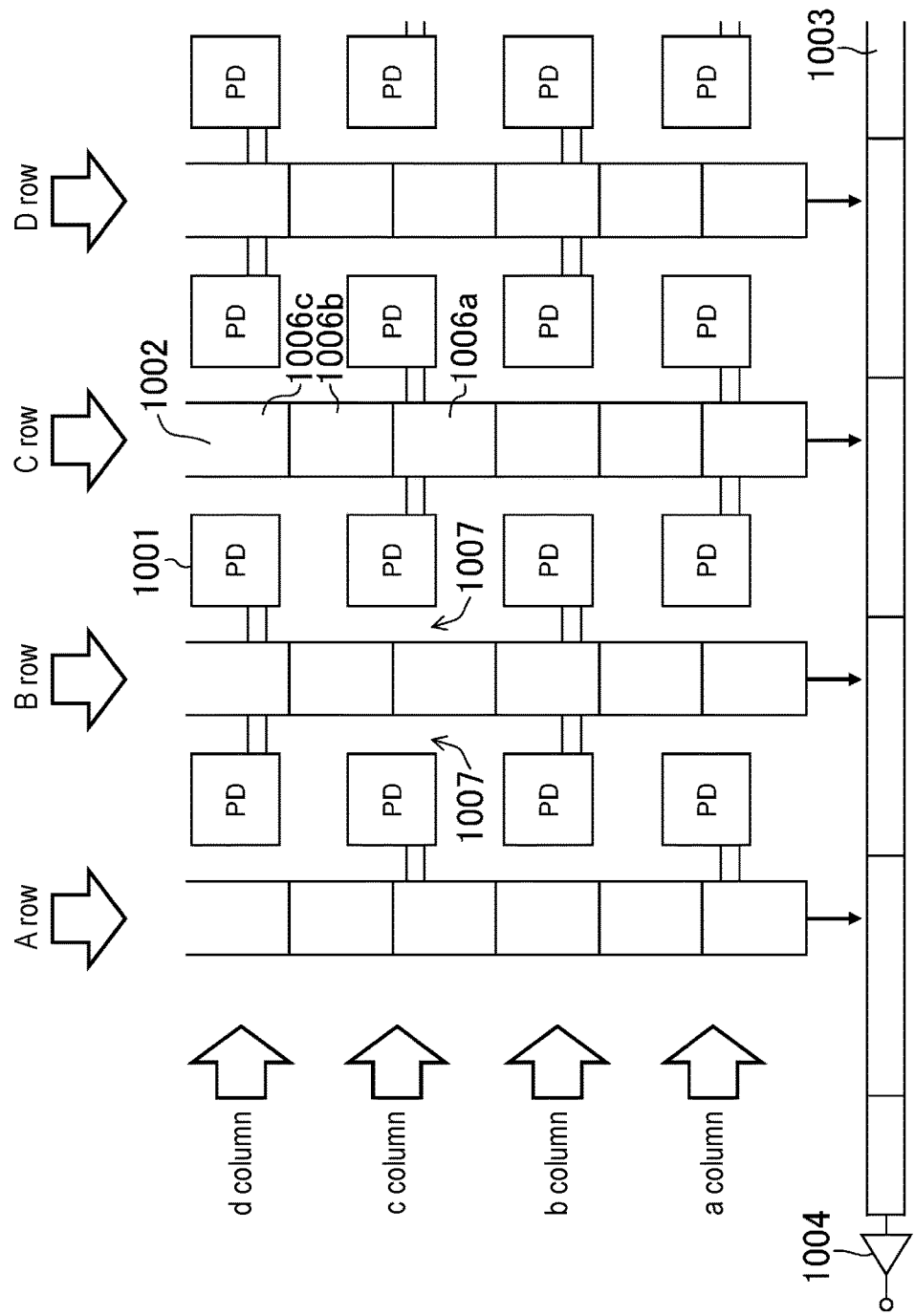
FIG. 6A is a plan view illustrating an operation of the solid-state imaging device illustrated in FIG. 5.

FIGS. 6A to 6F are plan views illustrating operations of the solid-state imaging device illustrated in FIG. 5. FIG. 6A illustrates an operation of the solid-state imaging device prior to exposure, while FIGS. 6B to 6F illustrate operations of the solid-state imaging device in respective exposure periods.

Initially, signal charges are not accumulated in corresponding packets 1006a to 1006c prior to the exposure periods as illustrated in FIG. 6A.

Figure 6B:
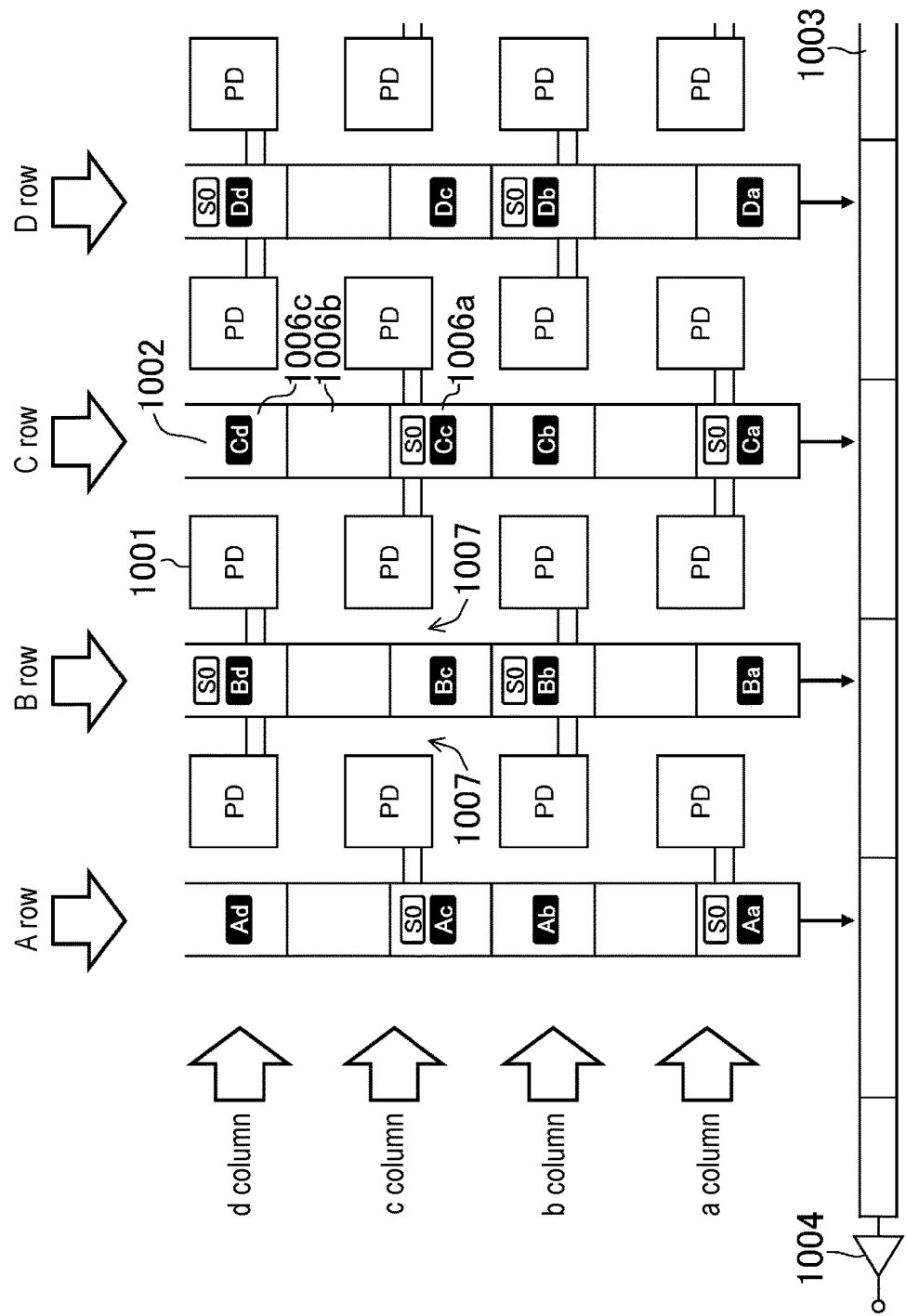
FIG. 6B is a plan view illustrating an operation of the solid-state imaging device illustrated in FIG. 5.

In first exposure period T1 of the exposure periods, signal charges S0 are initially read from photoelectric conversion units 1001 in columns a and c in the figure into vertical transfer units 1002 in rows A and C in the figure, and from photoelectric conversion units 1001 in columns b and d in the figure into vertical transfer units 1002 in rows B and D in the figure, and accumulated in corresponding vertical transfer units 1002 as illustrated in FIG. 6B. In this case, dark currents may be generated when a reading pulse is applied to reading electrodes 1005a and reading electrodes 1005b during reading operation. With regard to packet 1006a, dark current Cc is generated and accumulated in packet 1006a when signal charge S0 is read from photoelectric conversion unit 1001 in column c in the figure into vertical transfer unit 1002 in row C in the figure. On the other hand, with regard to packet 1006c, dark current Cd is generated and accumulated in packet 1006c when signal charge S0 is read from photoelectric conversion unit 1001 in column d in the figure in a state that reading electrodes 1005a and reading electrodes 1005b to which the reading pulse is applied are disposed in all rows. Reading and accumulation operations in this manner during first exposure period T1 are repeated a fixed number of times.

Figure 6C:
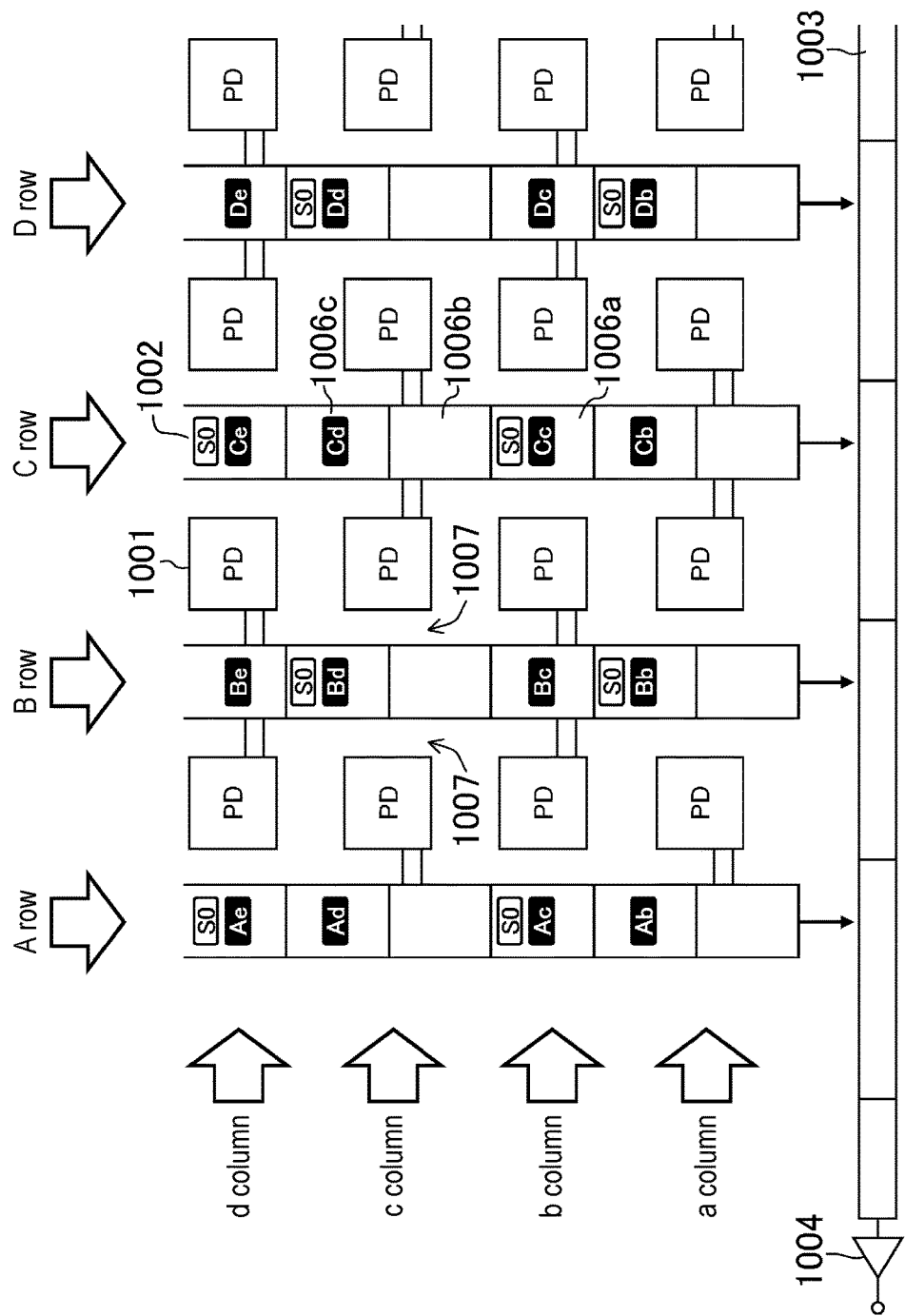
FIG. 6C is a plan view illustrating an operation of the solid-state imaging device illustrated in FIG. 5.

After completion of the reading and accumulation operations of first exposure period T1, packets in vertical transfer units 1002 are transferred downward in the figure by one stage as illustrated in FIG. 6C.

Figure 6D:
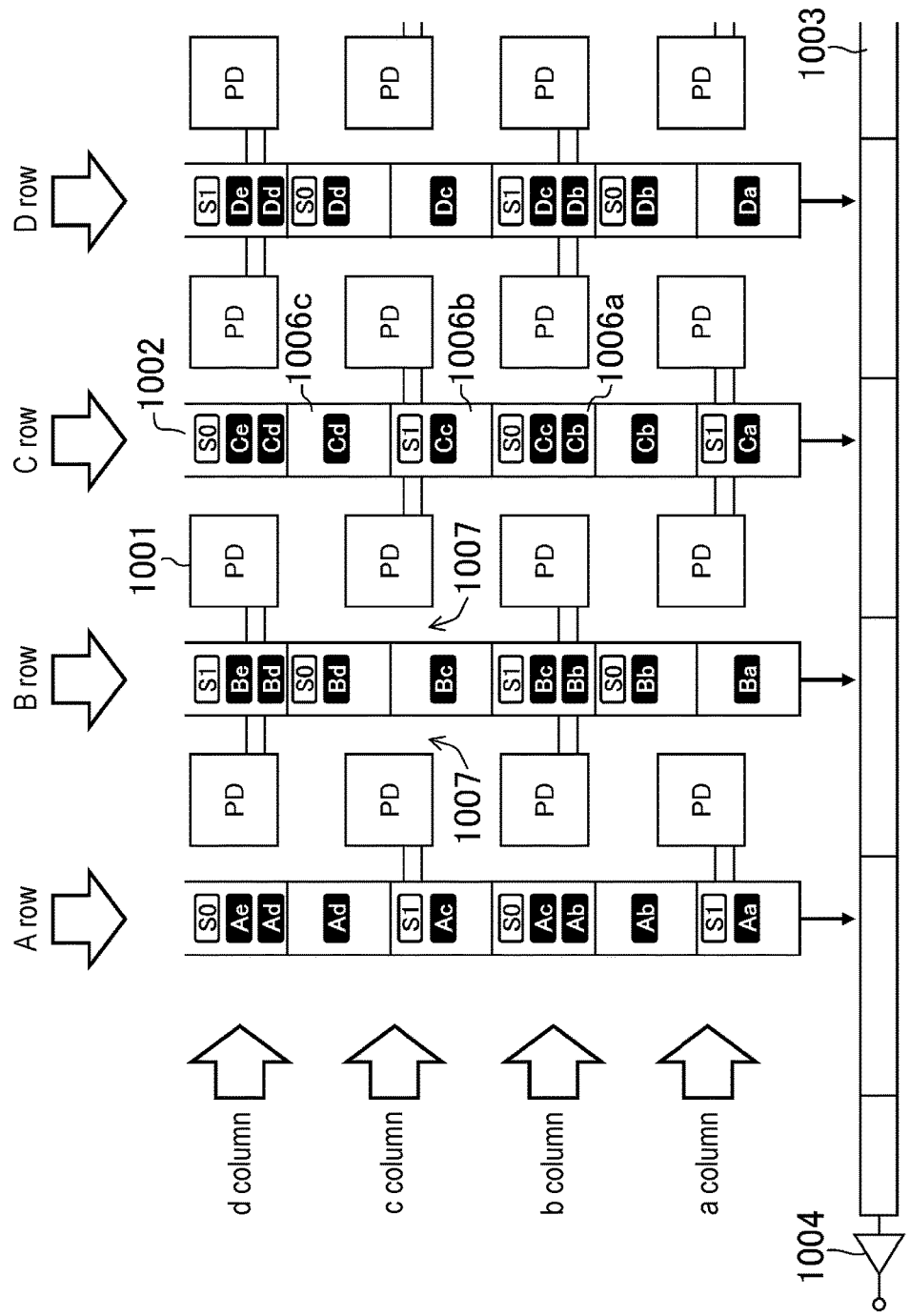
FIG. 6D is a plan view illustrating an operation of the solid-state imaging device illustrated in FIG. 5.

In subsequent second exposure period T2 of the exposure periods, signal charges S1 are read from photoelectric conversion units 1001 in columns a and c in the figure into vertical transfer units 1002 in rows A and C in the figure, and from photoelectric conversion units 1001 in columns b and d in the figure into vertical transfer units 1002 in rows B and D in the figure, and accumulated in corresponding vertical transfer units 1002 as illustrated in FIG. 6D. In this case, dark currents may be generated when a reading pulse is applied to reading electrodes 1005a and reading electrodes 1005b during reading operation. With regard to packet 1006b, dark current Cc is generated and accumulated in packet 1006b when signal charge S1 is read from photoelectric conversion unit 1001 in column c in the figure into vertical transfer unit 1002 in row C in the figure. On the other hand, with regard to packet 1006a, dark current Cb is generated and accumulated in packet 1006a when signal charge S1 is read from photoelectric conversion unit 1001 in column b in the figure in a state that reading electrodes 1005a and reading electrodes 1005b to which the reading pulse is applied are disposed in all rows. Reading and accumulation operations in this manner during second exposure period T2 are repeated the same number of times as the number of times of the reading and accumulation operations of first exposure period T1.

Figure 6E:
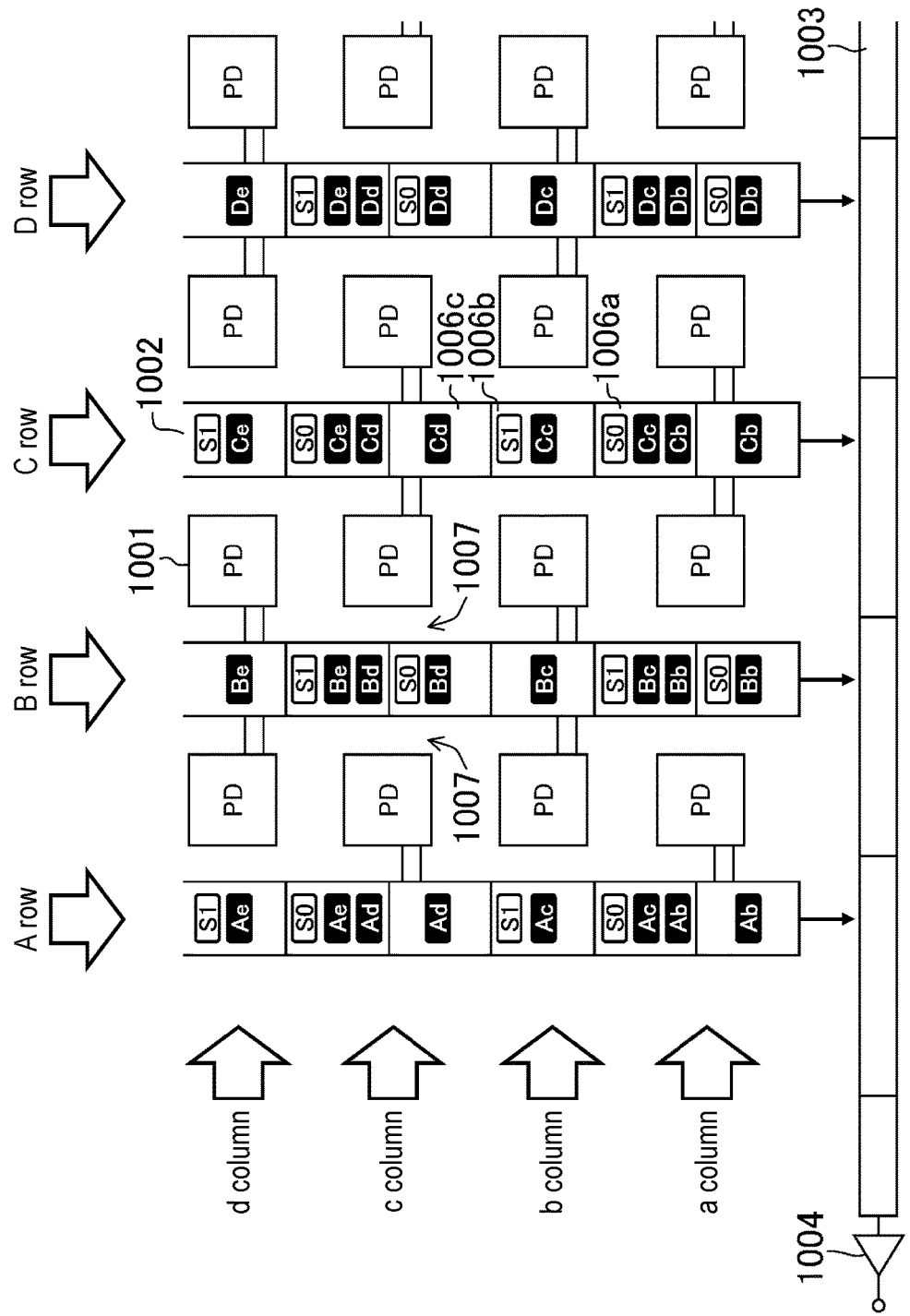
FIG. 6E is a plan view illustrating an operation of the solid-state imaging device illustrated in FIG. 5.

After completion of the reading and accumulation operations of second exposure period T2, packets in vertical transfer units 1002 are transferred downward in the figure by one stage as illustrated in FIG. 6E.

Figure 6F:
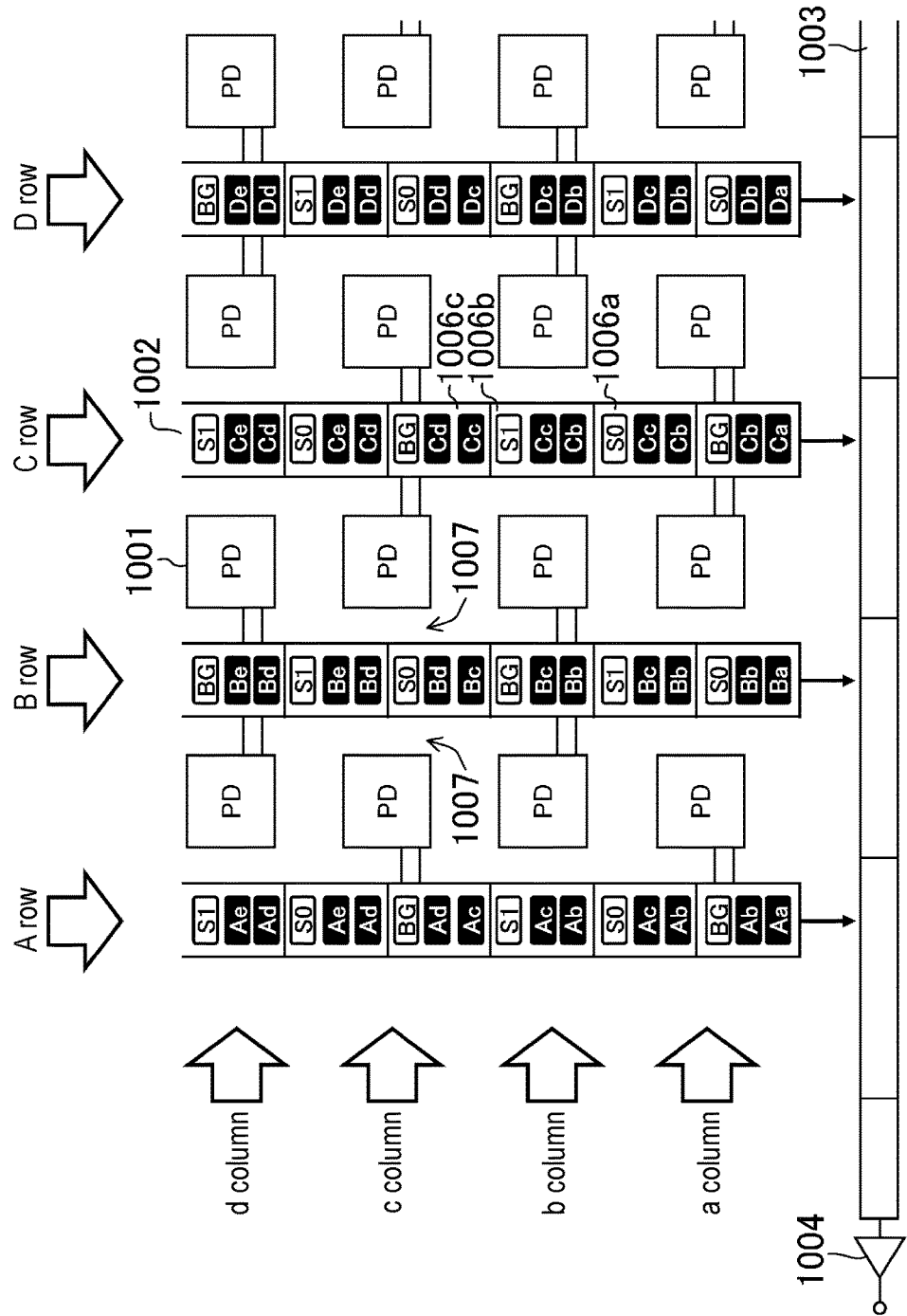
FIG. 6F is a plan view illustrating an operation of the solid-state imaging device illustrated in FIG. 5.

In subsequent third exposure period T3 of the exposure periods, signal charges BG are read from photoelectric conversion units 1001 in columns a and c in the figure into vertical transfer units 1002 in rows A and C in the figure, and from photoelectric conversion units 1001 in columns b and d in the figure into vertical transfer units 1002 in rows B and D in the figure, and accumulated in corresponding vertical transfer units 1002 as illustrated in FIG. 6F. In this case, dark currents may be generated when a reading pulse is applied to reading electrodes 1005a and reading electrodes 1005b during reading operation. With regard to packet 1006c, dark current Cc is generated and accumulated in packet 1006c when signal charge BG is read from photoelectric conversion unit 1001 in column c in the figure into vertical transfer unit 1002 in row C in the figure. On the other hand, with regard to packet 1006b, dark current Cb is generated and accumulated in packet 1006b when signal charge BG is read from photoelectric conversion unit 1001 in column b in the figure in a state that reading electrodes 1005a and reading electrodes 1005b to which the reading pulse is applied are disposed in all rows. Reading and accumulation operations in this manner during third exposure period T3 are repeated the same number of times as the number of times of the reading and accumulation operations of each of first exposure period T1 and second exposure period T2.

Thereafter, packets of vertical transfer units 1002 are transferred upward in the figure by two stages. After the transfer, a plurality of sets of the operations illustrated in FIGS. 6B to 6F are performed. Then, signal charges are transferred from vertical transfer units 1002 to horizontal transfer unit 1003 stage by stage, and sequentially transferred and output from horizontal transfer unit 1003 to charge detector 1004.

With regard to signal charges accumulated in packets 1006a to 1006c in FIG. 6F, there are accumulated (S0+Cc+Cb) in packet 1006a, (S1+Cc+Cb) in packet 1006b, and (BG+Cc+Cd) in packet 1006c. Signal charges S0, S1, and BG of packets 1006a to 1006c are signals read from identical photoelectric conversion unit 1001. In this case, delay Δt is calculated from these signals by using a following equation.

$$\Delta t = Tp\{(S1-BG+Cb-Cd)/(S0-BG+Cb-Cd)\}$$

In this equation, dark currents Cb and Cd are signals independent from a delay, and generated from different sources. In this case, variations of signal levels thus produced may cause errors or variations in distance measurement results. As a result, distance measurement accuracy may lower.

For overcoming this problem, according to following exemplary embodiments, reading electrodes are oppositely located in an up-down direction for each column to unify sources into an identical source and equalize signal levels of dark currents contained in signal charges S0, S1, and BG in the state that pixels are positioned in a checkered pattern. According to this structure, errors and variations of distance measurement results decrease, wherefore distance measurement accuracy of the imaging device improves.

Exemplary embodiments for solving the aforementioned problems are hereinafter described with reference to the drawings. Description with reference to the accompanying drawings is presented only by way of example. It is not intended that the present disclosure be limited to the description herein. Elements of substantially identical configurations, operations, and effects in the respective figures are given identical reference marks.

Note that a "pixel" in the present specification includes a photoelectric conversion unit, a reading electrode, and at least one vertical transfer electrode constituting a vertical transfer unit, and corresponds to a unit cell repeatedly disposed in a solid-state imaging device.

FIG. 7 is a schematic configuration diagram of a distance measuring camera including a solid-state imaging device. As illustrated in FIG. 7, infrared light is applied from infrared light source 13 to subject 11 under background light source 12. Reflected light of the infrared light is received by solid-state imaging device 15 via optical lens 14. An image formed on solid-state imaging device 15 is converted into an electric signal. Operations of infrared light source 13 and solid-state imaging device 15 are controlled by controller 16. Output from solid-state imaging device 15 is converted into a distance image by signal processor 17, and also a visible image depending on a purpose of use. Infrared light source 13, optical lens 14, and solid-state imaging device 15 corresponding to a CCD image sensor, for example, constitute a distance measuring camera.

Discussed in each of first to fourth exemplary embodiments is a solid-state imaging device in a mode of an imaging device suitable for the distance measuring camera described above.

First Exemplary Embodiment

FIG. 8 is a view illustrating a configuration of a solid-state imaging device according to the first exemplary embodiment. Only four pixels in the vertical direction and four pixels in the horizontal direction are shown in FIG. 8 for simplifying the figure.

As illustrated in FIG. 8, the solid-state imaging device in this exemplary embodiment contains pixels disposed in a matrix form on a semiconductor substrate, and includes a plurality of photoelectric conversion units 101 which receives incident light containing infrared light and converts the incident light into signal charges, vertical transfer units 102 provided in correspondence with photoelectric conversion units 101 and transferring signal charges read from photoelectric conversion units 101 in a column direction, horizontal transfer unit 103 transferring signal charges received from vertical transfer units 102 in a row direction, and charge detector 104 outputting signal charges received from horizontal transfer unit 103. The solid-state imaging device further includes first reading electrodes 105a and second reading electrodes 105b. First reading electrode 105a or second reading electrode 105b is provided for each of photoelectric conversion units 101 to read signal charges from photoelectric conversion units 101 into vertical transfer units 102 for each row. Positions of reading electrodes 105a, 105b are hatched in FIG. 8.

First reading electrodes 105a and second reading electrodes 105b are disposed on an upper side or a lower side with respect to centers of corresponding photoelectric conversion units 101 in the row direction, and oppositely located in the up-down direction for each column. For example, first reading electrodes 105a provided for photoelectric conversion units 101 of pixels in column a and column c in the figure are disposed on the lower side with respect to the centers of photoelectric conversion units 101. Second reading electrodes 105b provided for photoelectric conversion units 101 of pixels in column b and column d in the figure are disposed on the upper side with respect to the centers of photoelectric conversion units 101. Accordingly, as hatched in the figure, reading electrodes 105a and 105b are disposed in a line in the column direction, and shifted on the upper side or the lower side in the row direction with respect to the centers of corresponding photoelectric conversion units 101 alternately for each column.

The solid-state imaging device is constituted of a CCD image sensor. For example, each of vertical transfer units 102 is an eight-phase driving unit having eight gates of vertical transfer electrodes 105 per two pixels, and contains three packets 106a to 106c per two photoelectric conversion units 101. Horizontal transfer unit 103 is a two-phase driving unit. Vertical transfer electrodes 105a and 105b of eight-phase driving vertical transfer units 102 are configured to function as reading electrodes as well for reading signal charges from photoelectric conversion units 101. Signal charges accumulated in the photoelectric conversion units are read by electrodes such as signal packet 106a.

In addition, first reading electrodes 105*a* and second reading electrodes 105*b* each have a structure which simultaneously achieves reading from each of photoelectric conversion units 101 adjacent to each other in the horizontal direction with corresponding vertical transfer unit 102 interposed between adjoining photoelectric conversion units 101, and adds the readings. In this case, the added pixels are shifted from each other by one pixel for each row and by one pixel for each column such that respective centers of gravity of the added pixels are located in a checkered pattern after addition. In the figure, pixels including photoelectric conversion units 101 from which signal charges are read into vertical transfer units 102 on the left side correspond to first pixels. On the other hand, pixels including photoelectric conversion units 101 from which signal charges are read into vertical transfer units 102 on the right side correspond to second pixels.

First reading electrodes 105*a* and second reading electrodes 105*b* are disposed in all rows. In this case, positions where reading from photoelectric conversion units 101 on both sides is prohibited, and positions where reading from photoelectric conversion units 101 on both sides is allowed are present in a checkered pattern as illustrated in FIG. 8. Accordingly, channel stop areas 107 are formed on both sides of first reading electrodes 105*a* and second reading electrodes 105*b* from which signal charges are not read to prohibit reading of signal charges into vertical transfer units 102 when a reading pulse is applied to first reading electrodes 105*a* and second reading electrodes 105*b*. On the other hand, channel stop areas 107 are provided on neither side of first reading electrodes 105*a* and second reading electrodes 105*b* from which signal charges need to be read to allow easy reading of the signal charges.

Figure 9A:
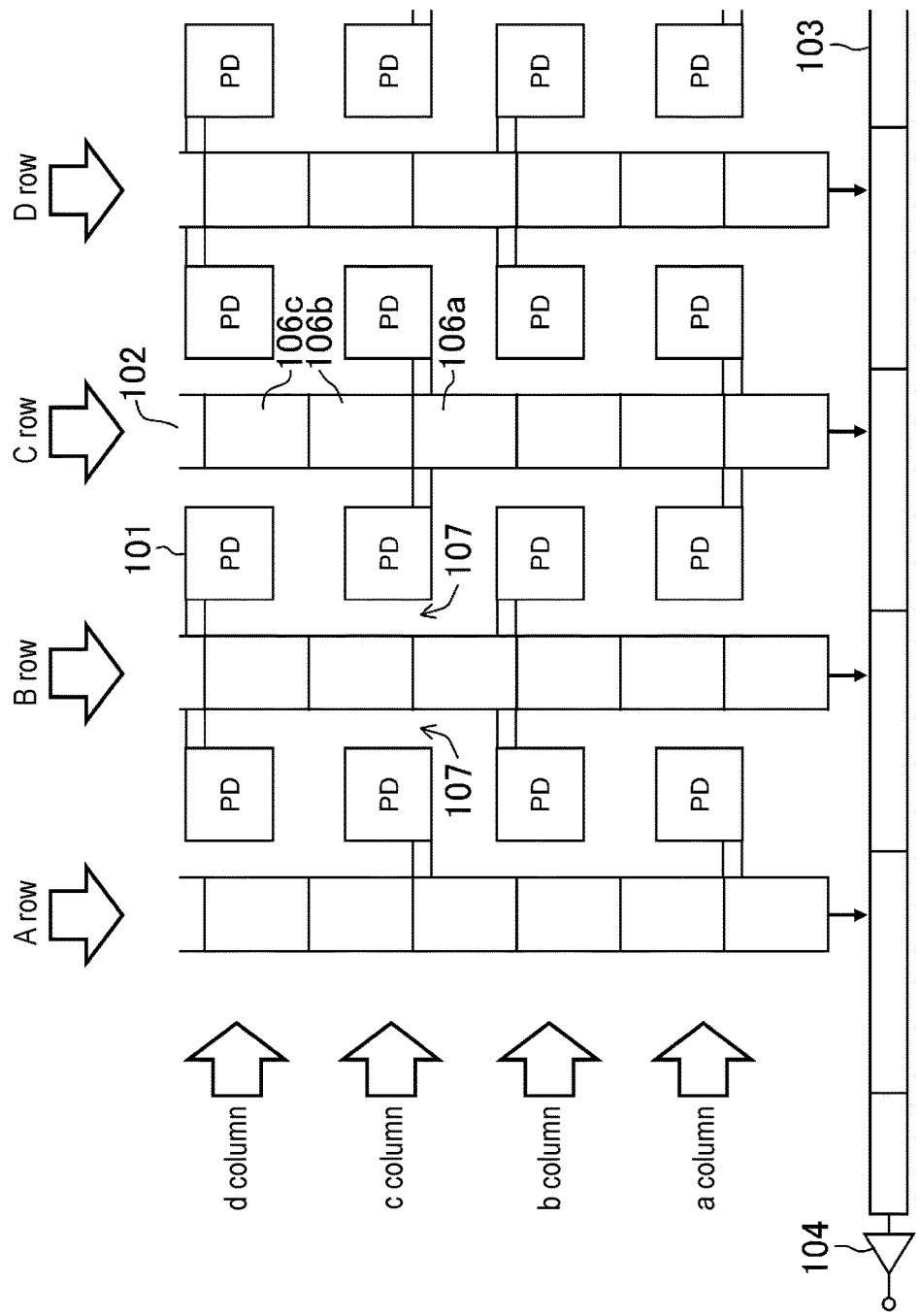
FIG. 9A is a plan view illustrating an operation of the solid-state imaging device illustrated in FIG. 8.

FIGS. 9A to 9F are plan views illustrating operations of the solid-state imaging device illustrated in FIG. 8. FIG. 9A illustrates an operation of the solid-state imaging device prior to exposure, while FIGS. 9B to 9F illustrate operations of the solid-state imaging device during respective exposure periods.

Initially, signal charges are not accumulated in corresponding packets 106*a* to 106*c* prior to the exposure periods as illustrated in FIG. 9A.

Figure 9B:
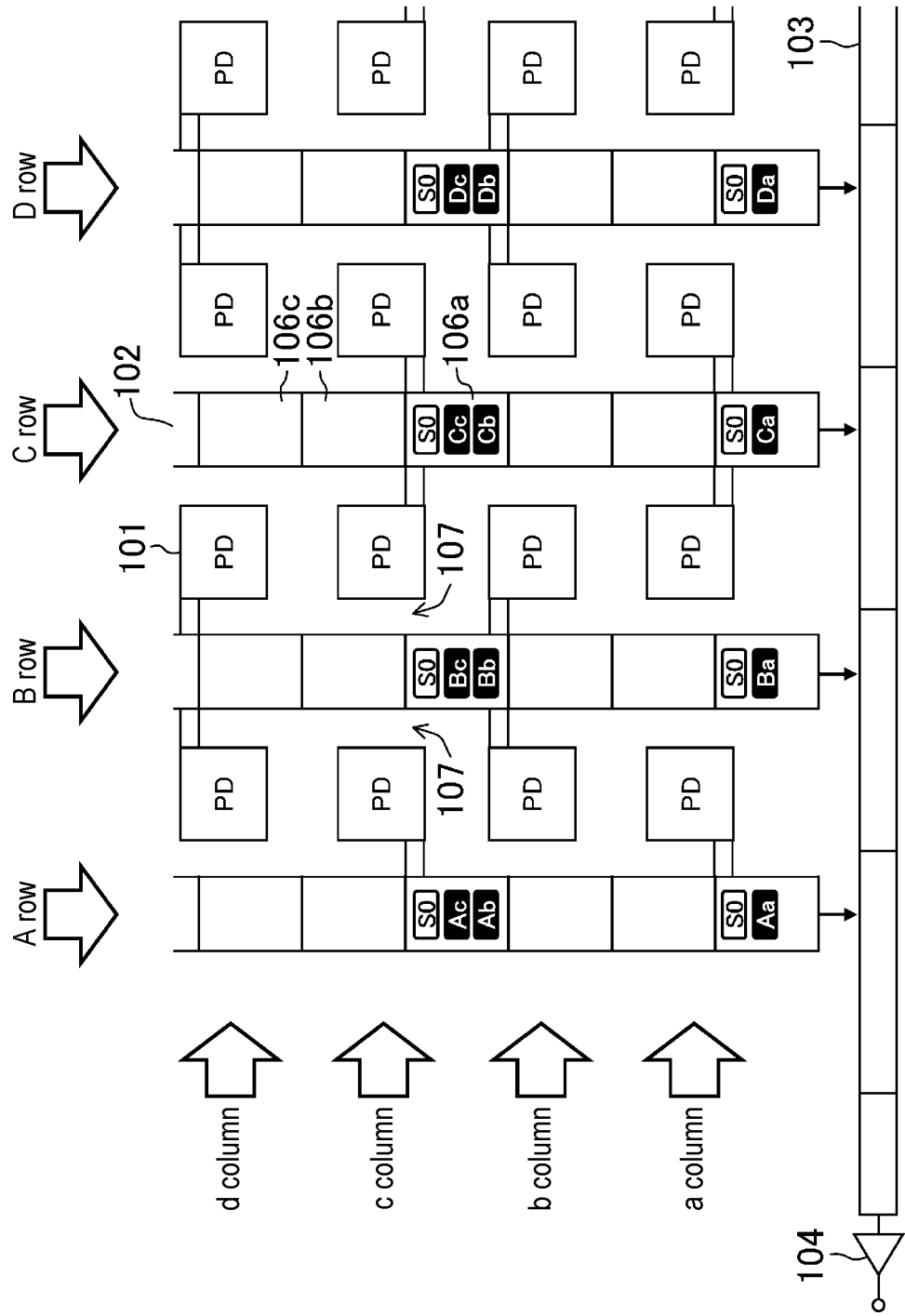
FIG. 9B is a plan view illustrating an operation of the solid-state imaging device illustrated in FIG. 8.

In first exposure period T1 of the exposure periods, signal charges S0 are initially read from photoelectric conversion units 101 in columns a and c in the figure into vertical transfer units 102 in rows A and C in the figure, and from photoelectric conversion units 101 in columns b and d in the figure into vertical transfer units 102 in rows B and D in the figure, and accumulated in corresponding vertical transfer units 102 as illustrated in FIG. 9B. In this case, dark currents may be generated when a reading pulse is applied to reading electrodes 105*a* and reading electrodes 105*b* during reading operation. With regard to packet 106*a*, dark current Cc is generated and accumulated in packet 106*a* when signal charge S0 is read from photoelectric conversion unit 101 in column c in the figure into vertical transfer unit 102 in row C in the figure. Moreover, dark current Cb is generated when signal charge S0 is read from photoelectric conversion units 101 in column b in a state that reading electrodes 105*a* and reading electrodes 105*b* to which the reading pulse is applied are disposed in all rows. In this case, reading electrodes 105*a* and reading electrodes 105*b* are oppositely located in the up-down direction for each column, wherefore dark current Cb is generated and accumulated in packet 106*b* similarly to dark current Cc. Reading and accumulation operations in this manner during first exposure period T1 are repeated a fixed number of times.

Figure 9C:
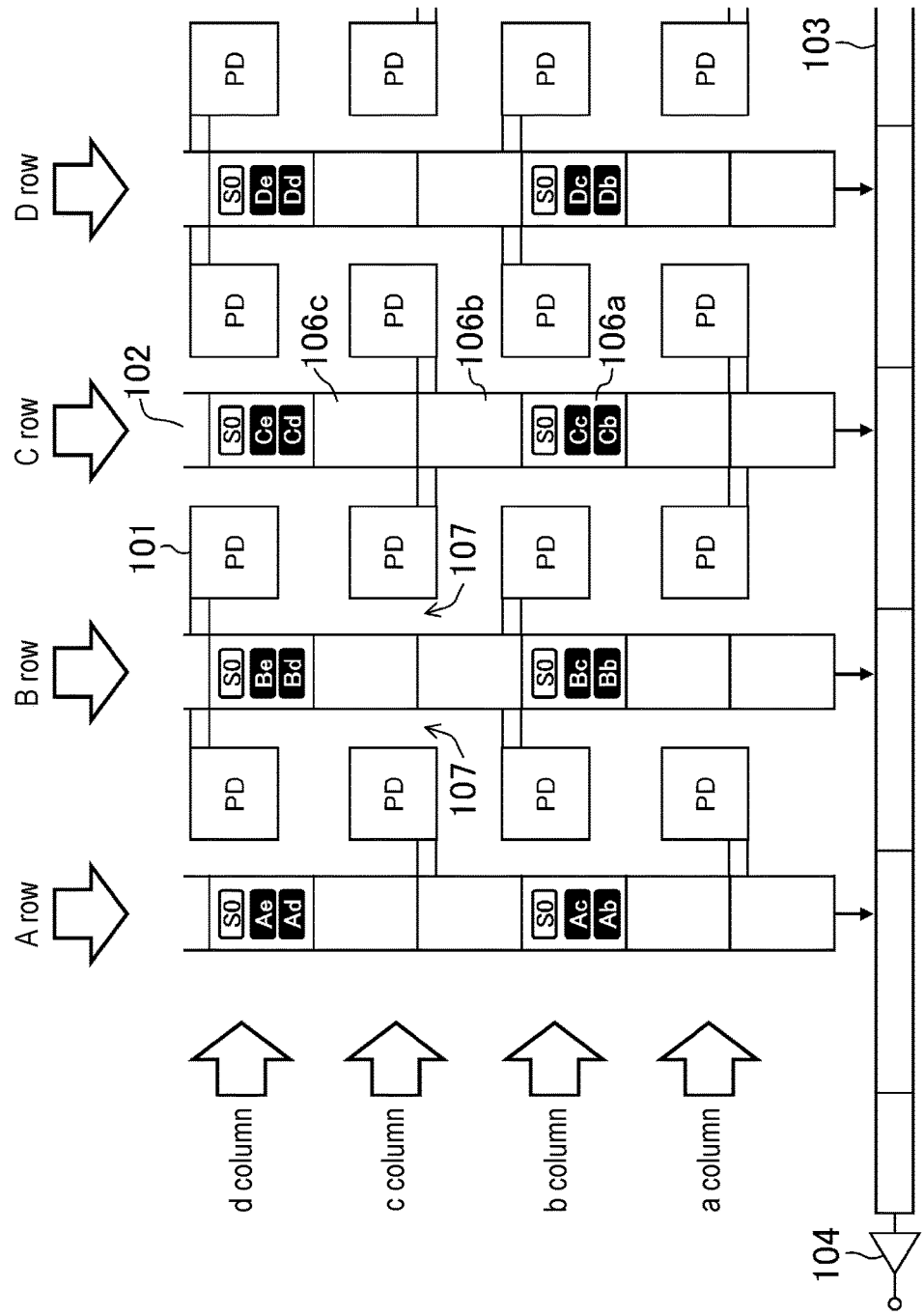
FIG. 9C is a plan view illustrating an operation of the solid-state imaging device illustrated in FIG. 8.

After completion of the reading and accumulation operations of first exposure period T1, packets in vertical transfer units 102 are transferred downward in the figure by one stage as illustrated in FIG. 9C.

Figure 9D:
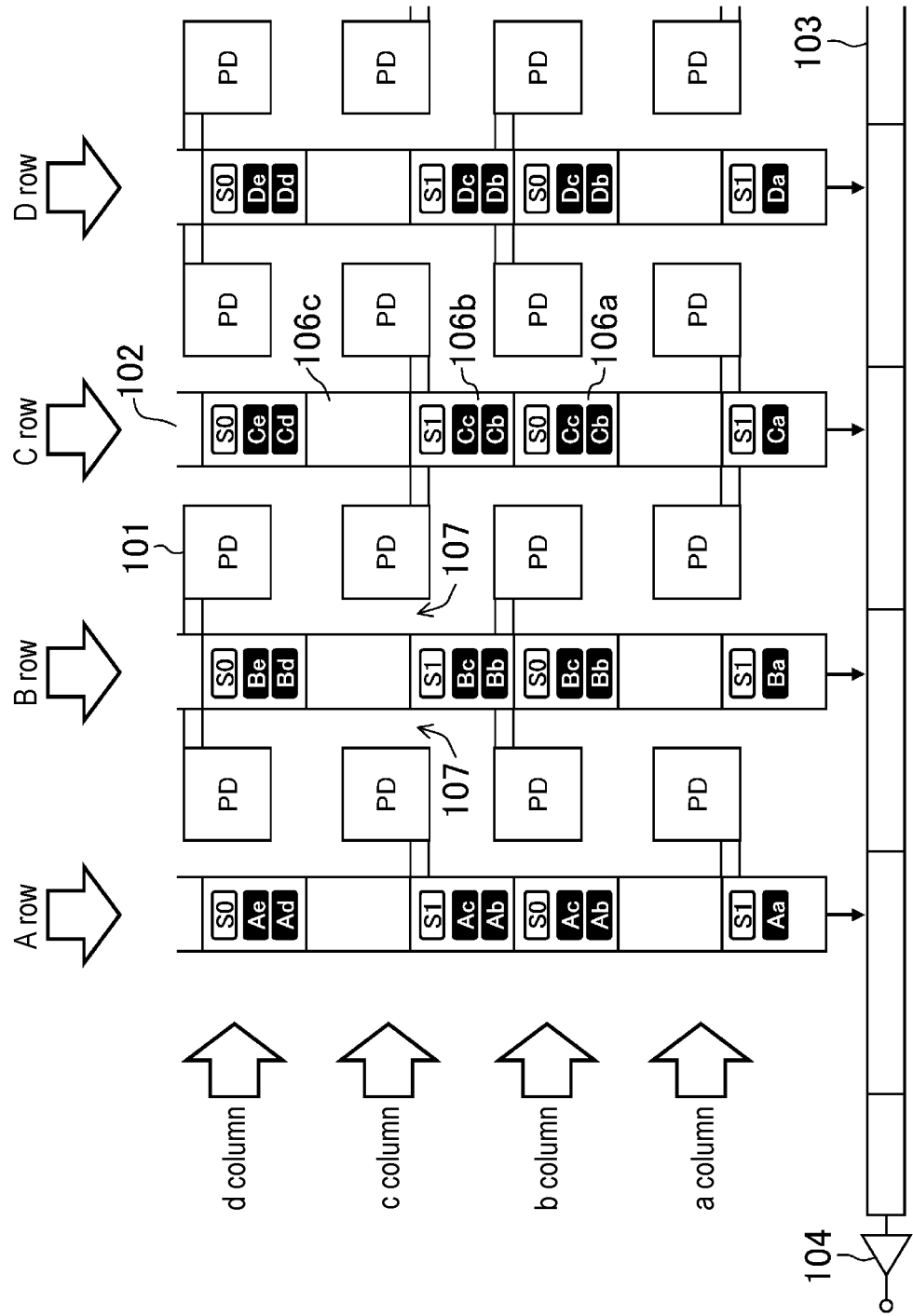
FIG. 9D is a plan view illustrating an operation of the solid-state imaging device illustrated in FIG. 8.

In subsequent second exposure period T2 of the exposure periods, signal charges S1 are read from photoelectric conversion units 101 in columns a and c in the figure into vertical transfer units 102 in rows A and C in the figure, and from photoelectric conversion units 101 in columns b and d in the figure into vertical transfer units 102 in rows B and D in the figure, and accumulated in corresponding vertical transfer units 102 as illustrated in FIG. 9D. In this case, dark currents may be generated when a reading pulse is applied to reading electrodes 105*a* and reading electrodes 105*b* during reading operation. With regard to packet 106*b*, dark current Cc is generated and accumulated in packet 106*b* when signal charge S1 is read from photoelectric conversion unit 101 in column c in the figure into vertical transfer unit 102 in row C in the figure. Moreover, dark current Cb is generated when signal charge S1 is read from photoelectric conversion units 101 in column b in a state that reading electrodes 105*a* and reading electrodes 105*b* to which the reading pulse is applied are disposed in all rows. In this case, reading electrodes 105*a* and reading electrodes 105*b* are oppositely located in the up-down direction for each column, wherefore dark current Cb is generated and accumulated in packet 106*b* similarly to dark current Cc. Reading and accumulation operations in this manner during second exposure period T2 are repeated the same number of times as the number of times of the reading and accumulation operations of first exposure period T1.

Figure 9E:
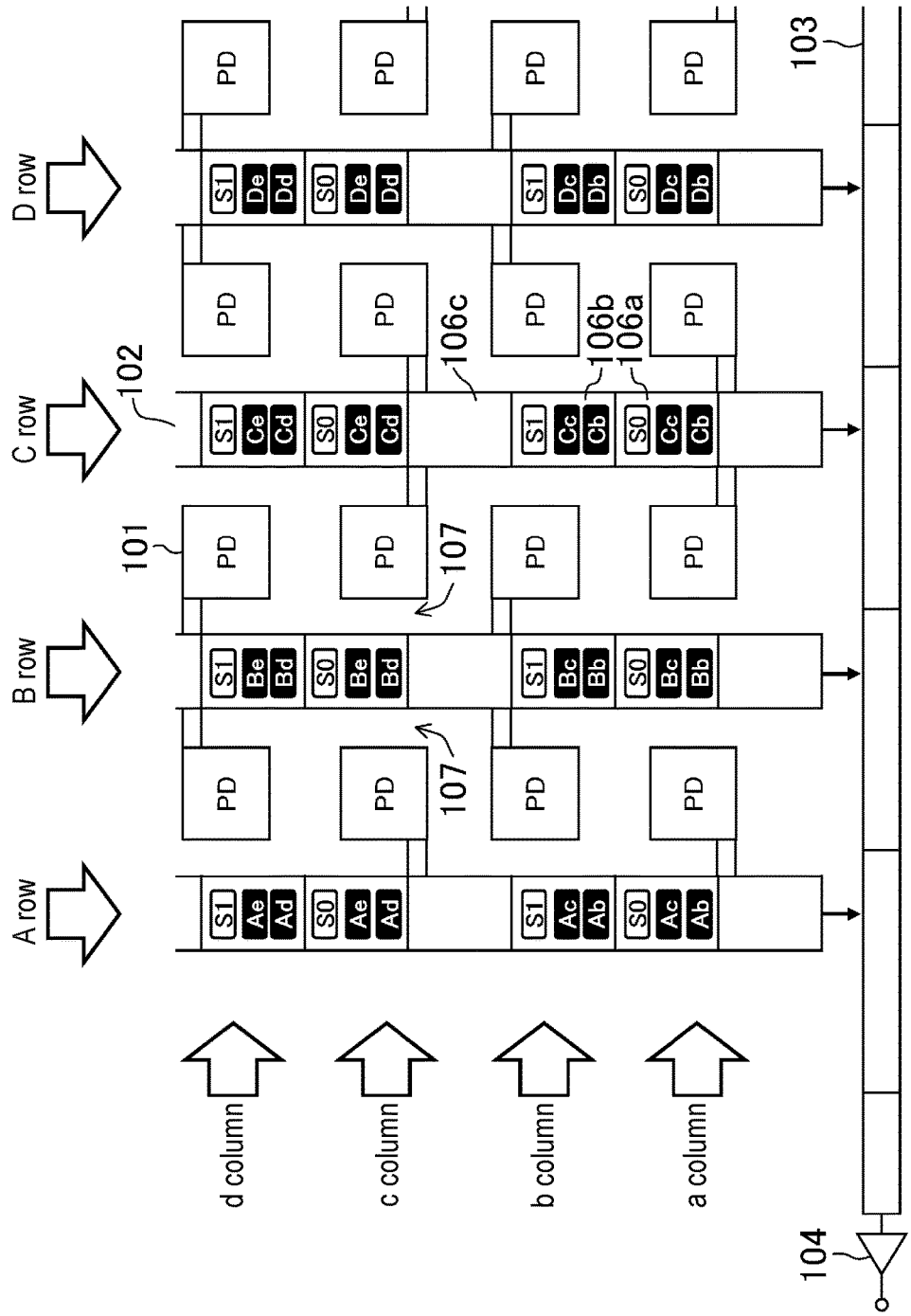
FIG. 9E is a plan view illustrating an operation of the solid-state imaging device illustrated in FIG. 8.

After completion of the reading and accumulation operations of second exposure period T2, packets in vertical transfer units 102 are transferred downward in the figure by one stage as illustrated in FIG. 9E.

In subsequent third exposure period T3, signal charges BG are read from photoelectric conversion units 101 in columns a and c in the figure into vertical transfer units 102 in rows A and C in the figure, and from photoelectric conversion units 101 in columns b and d in the figure into vertical transfer units 102 in rows B and D in the figure, and accumulated in corresponding vertical transfer units 102 as illustrated in FIG. 9F. In this case, dark currents may be generated when a reading pulse is applied to reading electrodes 105*a* and reading electrodes 105*b* during reading operation. With regard to packet 106*c*, dark current Cc is generated and accumulated in packet 106*c* when signal charge BG is read from photoelectric conversion unit 101 in column c in the figure into vertical transfer unit 102 in row C in the figure. Moreover, dark current Cb is generated when signal charge BG is read from photoelectric conversion units 101 in column b in a state that reading electrodes 105*a* and reading electrodes 105*b* to which the reading pulse is applied are disposed in all rows. In this case, reading electrodes 105*a* and reading electrodes 105*b* are oppositely located in the up-down direction for each column, wherefore dark current Cb is generated and accumulated in packet 106*c* similarly to dark current Cc. Reading and accumulation operations in this manner during third exposure period T3 are repeated the same number of times as the number of times of the reading and accumulation operations of each of first exposure period T1 and second exposure period T2.

Thereafter, packets of vertical transfer units 102 are transferred upward in the figure by two stages. After the transfer, a plurality of sets of the operations illustrated in FIGS. 9B to 9F are performed. Then, signal charges are transferred from vertical transfer units 102 to horizontal transfer unit 103 stage by stage, and sequentially transferred and output from horizontal transfer unit 103 to charge detector 104.

With regard to signal charges accumulated in packets 106a to 106c in FIG. 9F, there are accumulated (S0+Cc+Cb) in packet 106a constituted of electrode name V8, (S1+Cc+Cb) in packet 106b constituted of electrode name V6, and (BG+Cc+Cb) in packet 106c constituted of electrode names V2, V3, and V4. In this case, signal charges of the same type are accumulated under electrodes of the same phase for each row. In other words, (S0+dark current) is accumulated in packets constituted of electrode name V8, (S1+dark current) is accumulated in packets constituted of electrode name V6, and (BG+dark current) is accumulated in packets constituted of electrode names V2, V3, and V4. Signal charges S0, S1, and BG of packets 106a to 106c are signals read from identical photoelectric conversion unit 101. In this case, delay Δt is calculated from these signals by using a following equation.

$$\Delta t = Tp\{(S1-BG)/(S0-BG)\}$$

According to the solid-state imaging device in the first exemplary embodiment, centers of gravity of added pixels are disposed in a checkered pattern for improving the horizontal and vertical resolutions. In this structure, first reading electrodes 105a and second reading electrodes 105b are disposed on the upper side or the lower side with respect to the center of corresponding photoelectric conversion unit 101, and are oppositely located in the up-down direction for each column. Accordingly, sources and signal levels of dark currents contained in signal charges S0, S1, and BG can be unified and equalized. In this case, delay Δt does not contain a dark current component, wherefore reduction of errors and variations of distance measurement results, and improvement of distance measurement accuracy of the imaging device are achievable.

Second Exemplary Embodiment

Figure 10:
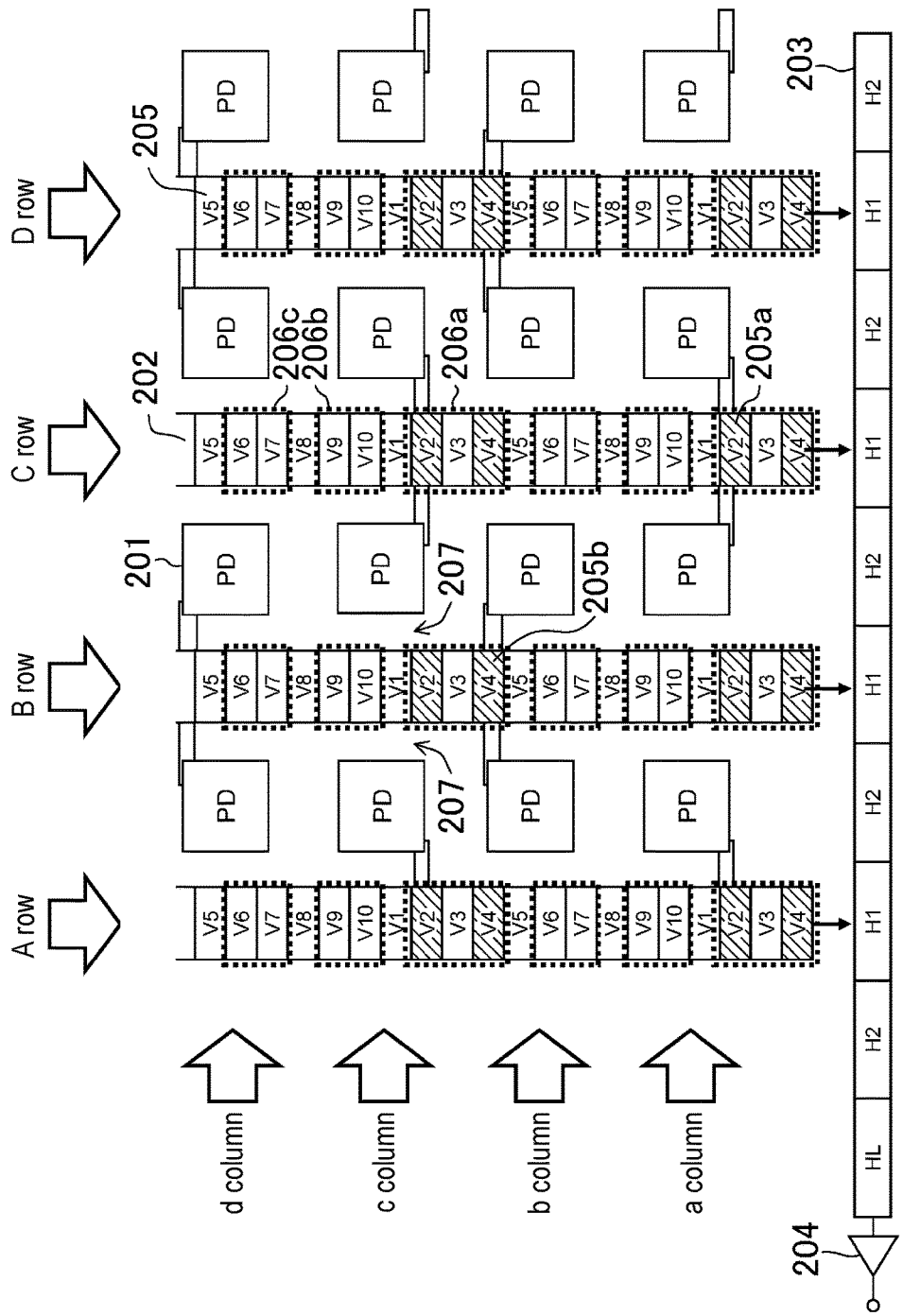
FIG. 10 is a plan view illustrating a configuration of a solid-state imaging device according to a second exemplary embodiment.

FIG. 10 is a view illustrating a configuration of a solid-state imaging device according to the second exemplary embodiment. Only four pixels in the vertical direction and four pixels in the horizontal direction are shown in FIG. 10 for simplifying the figure.

As illustrated in FIG. 10, the solid-state imaging device in this exemplary embodiment includes a plurality of photo-electric conversion units 201 disposed in a matrix form on a semiconductor substrate and converting incident light into signal charges, vertical transfer units 202 provided in correspondence with photoelectric conversion units 201 and transferring signal charges read from photoelectric conversion units 201 in a column direction, horizontal transfer unit 203 transferring signal charges received from vertical transfer units 202 in a row direction, and charge detector 204 outputting signal charges received from horizontal transfer unit 203. The solid-state imaging device further includes first reading electrodes 205a and second reading electrodes 205b. First reading electrode 205a or second reading electrode 205b is provided for each of photoelectric conversion units 201 to read signal charges from photoelectric conversion units 201 into vertical transfer units 202 for each row. Positions of reading electrodes 205a, 205b are hatched in FIG. 10. Areas indicated by reference mark 207 are channel stop areas.

As hatched in the figure, reading electrodes 205a, 205b are disposed in a line in the column direction, and shifted on the upper side or the lower side in the row direction with respect to centers of corresponding photoelectric conversion units 201 alternately for each column.

The solid-state imaging device according to the second exemplary embodiment has an electrode configuration of vertical transfer units 202 different from the corresponding configuration of the solid-state imaging device according to the first exemplary embodiment. Accordingly, the number of vertical transfer electrodes 205 constituting one packet is different. However, an object for providing a structure capable of unifying sources of dark currents contained in a plurality of signal charges read from one photoelectric conversion unit into an identical source according to this exemplary embodiment is equivalent to the object of the solid-state imaging device according to the first exemplary embodiment. Differences from the first exemplary embodiment are chiefly discussed herein. Identical points are not repeatedly explained.

According to the solid-state imaging device illustrated in FIG. 10, each of vertical transfer units 202 is a ten-phase driving unit having ten gates of vertical transfer electrodes 205 per two pixels, unlike the solid-state imaging device illustrated in FIG. 8. The minimum number of electrodes constituting each of packets 206a to 206c is two rather than one.

While the number of transfer electrodes and the number of accumulation electrodes for transferring signal charges in the up-down direction in the figure are different from the corresponding numbers of the solid-state imaging device illustrated in FIG. 8, operations of the solid-state imaging device illustrated in FIG. 10 are similar to the operations illustrated in FIGS. 9A to 9F as viewed in units of packet, in comparison with the solid-state imaging device illustrated in FIG. 8.

According to the solid-state imaging device in the second exemplary embodiment, sources and signal levels of dark currents contained in signal charges S0, S1, and BG can be unified and equalized even when vertical transfer electrodes 205 are ten-phase driving units with ten gates per two pixels. In this case, the number of electrodes of vertical transfer electrodes 205 accumulating signal charges becomes larger than the corresponding number of the solid-state imaging device according to the first exemplary embodiment, wherefore a saturation signal amount and a distance measurement range increase.

Third Exemplary Embodiment

Figure 11:
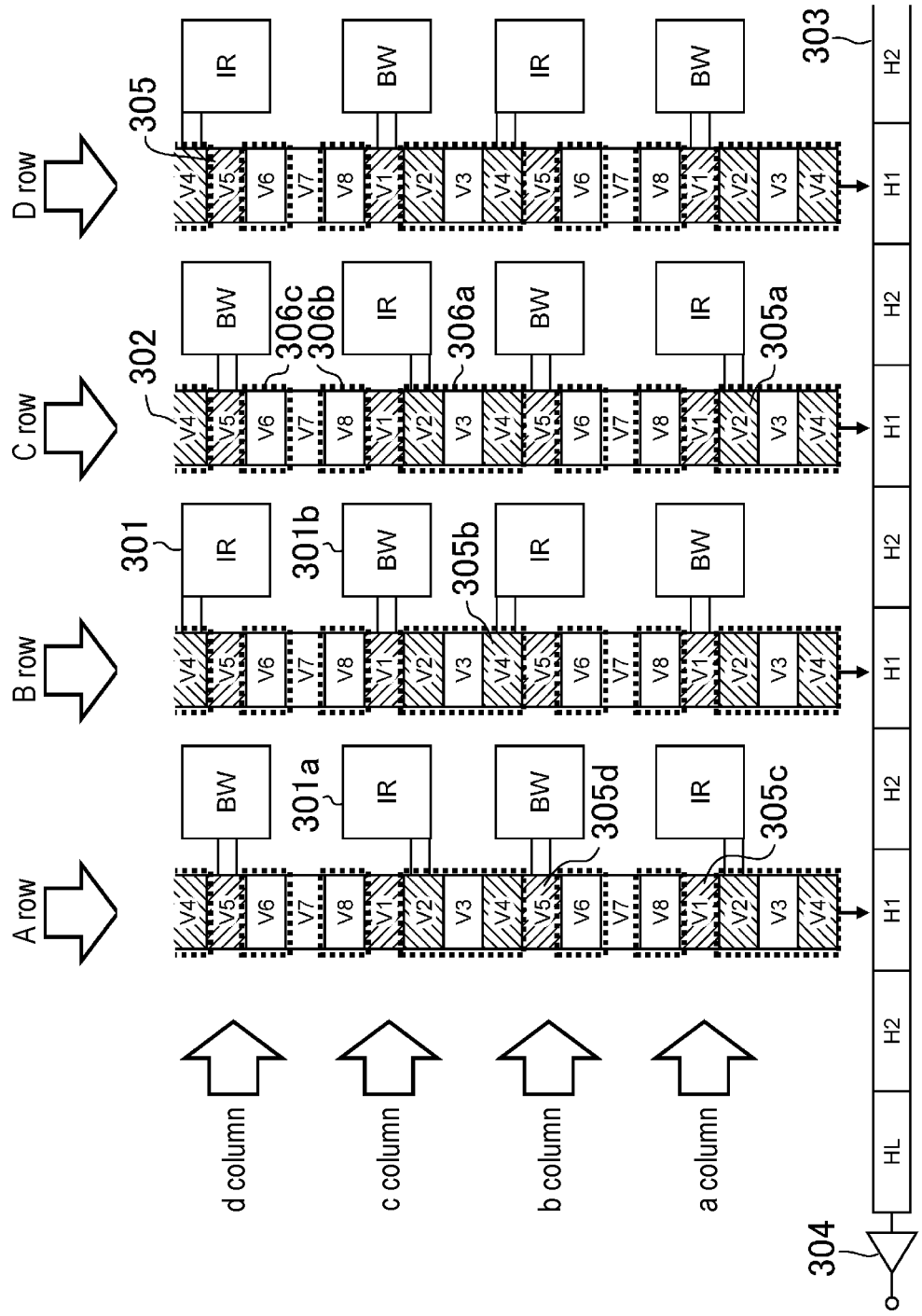
FIG. 11 is a plan view illustrating a configuration of a solid-state imaging device according to a third exemplary embodiment.

FIG. 11 is a view illustrating a configuration of a solid-state imaging device according to the third exemplary embodiment. Only four pixels in the vertical direction and four pixels in the horizontal direction are shown in FIG. 11 for simplifying the figure.

As illustrated in FIG. 11, the solid-state imaging device in this exemplary embodiment includes a plurality of photo-electric conversion units 301 disposed in a matrix form on a semiconductor substrate and converting incident light into signal charges, vertical transfer units 302 provided in correspondence with photoelectric conversion units 301 and transferring signal charges read from photoelectric conversion units 301 in a column direction, horizontal transfer unit 303 transferring signal charges received from vertical transfer units 302 in a row direction, and charge detector 304 outputting signal charges received from horizontal transfer unit 303. The solid-state imaging device further includes reading electrodes 305a to 305d. Each of reading electrodes 305a to 305d is provided for each of photoelectric conversion units 301 to read signal charges from photoelectric conversion units 301 into vertical transfer units 302 for each row. In FIG. 11, positions of reading electrodes 305a and 305b are hatched, while positions of reading electrodes 305c and 305d are hatched in a manner different from the hatches of the positions of reading electrodes 305a and 305b.

According to the solid-state imaging device in the third exemplary embodiment, filters provided for pixels are different from corresponding filters of the solid-state imaging device in the first embodiment. Accordingly, reading electrodes 305a to 305d are located at different positions. However, an object for providing a structure capable of unifying sources of dark currents contained in a plurality of signal charges read from one photoelectric conversion unit into an identical source according to this exemplary embodiment is equivalent to the object of the solid-state imaging device according to the first exemplary embodiment. Differences from the first exemplary embodiment are chiefly discussed herein. Identical points are not repeatedly explained.

According to the solid-state imaging device illustrated in FIG. 11, a half of photoelectric conversion units 301 are constituted of first photoelectric conversion units 301a provided with IR filters for shielding visible light, while a remaining half of photoelectric conversion units 301 are constituted of second photoelectric conversion units 301b provided with BW filters for shielding infrared light, unlike the solid-state imaging device illustrated in FIG. 8. In this case, first and second photoelectric conversion units 301a and 301b are disposed in a checkered pattern. Pixels including first photoelectric conversion units 301a correspond to first pixels, while pixels including second photoelectric conversion units 301b correspond to second pixels. Accordingly, capture of both a visible image and a distance image is realizable.

Moreover, first reading electrodes 305a and second reading electrodes 305b with respect to first photoelectric conversion units 301a are oppositely located in the up-down direction for each column, while positions of third reading electrodes 305c and fourth reading electrodes 305d with respect to second photoelectric conversion units 301b are uniform for each column. More specifically, as hatched in the figure, reading electrodes 305a and 305b associated with first photoelectric conversion units 301a in each column are disposed in a line in the column direction, and shifted to the upper side or the lower side in the row direction with respect to centers of corresponding photoelectric conversion units 301a alternately for each column. On the other hand, reading electrodes 305c and 305d associated with second photoelectric conversion units 301b in each column are disposed in a line in the column direction, and aligned with centers of corresponding photoelectric conversion units 301b in the row direction. Note that reading electrodes 305a to 305d have a structure which reads signal charges from photoelectric conversion units 301 without addition.

Figure 12B:
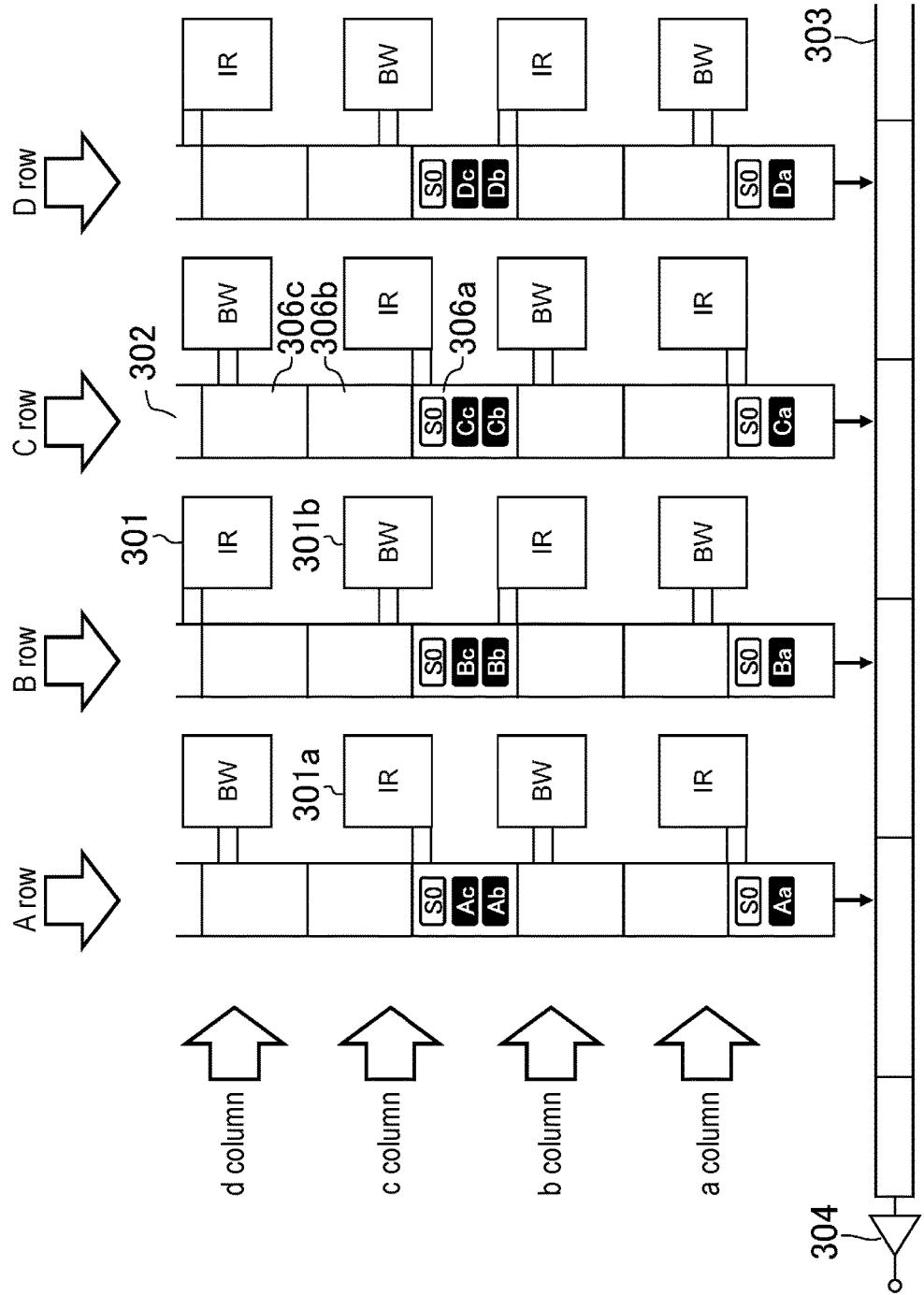
FIG. 12B is a plan view illustrating an operation of the solid-state imaging device illustrated in FIG. 11.

FIGS. 12A to 12F are plan views illustrating operations of the solid-state imaging device illustrated in FIG. 11. FIG. 12A illustrates an operation of the solid-state imaging device prior to exposure of a first frame, while FIGS. 12B to 12F illustrate operations of the solid-state imaging device during respective exposure periods of the first frame. FIG. 12G illustrates an operation of the solid-state imaging device prior to exposure of a second frame, while FIG. 12H illustrate an operation of the solid-state imaging device during an exposure period of the second frame.

Initially, signal charges are not accumulated in corresponding packets 306a to 306c prior to the exposure periods of the first frame as illustrated in FIG. 12A.

In first exposure period T1 of the exposure periods of the first frame, signal charges S0 are initially read from first photoelectric conversion units 301a in columns a and c in the figure into vertical transfer units 302 in rows A and C in the figure, and from first photoelectric conversion units 301a in columns b and d in the figure into vertical transfer units 302 in rows B and D in the figure, and accumulated in corresponding vertical transfer units 302 as illustrated in FIG. 12B. In this case, dark currents may be generated when a reading pulse is applied to reading electrodes 305a and reading electrodes 305b during reading operation. With regard to packet 306a, dark current Cc is generated and accumulated in packet 306a when signal charge S0 is read from photoelectric conversion unit 301 in column c in the figure into vertical transfer unit 302 in row C in the figure. Moreover, dark current Cb is generated when signal charge S0 is read from photoelectric conversion units 301 in column b in the figure in a state that reading electrodes 305a and reading electrodes 305b to which the reading pulse is applied are disposed in all rows. In this case, reading electrodes 305a and reading electrodes 305b are oppositely located in the up-down direction for each column, wherefore dark current Cb is generated and accumulated in packet 306a similarly to dark current Cc. Reading and accumulation operations in this manner during first exposure period T1 are repeated a fixed number of times.

After completion of the reading and accumulation operations of first exposure period T1, packets in vertical transfer units 302 are transferred downward in the figure by one stage as illustrated in FIG. 12C.

Figure 12D:
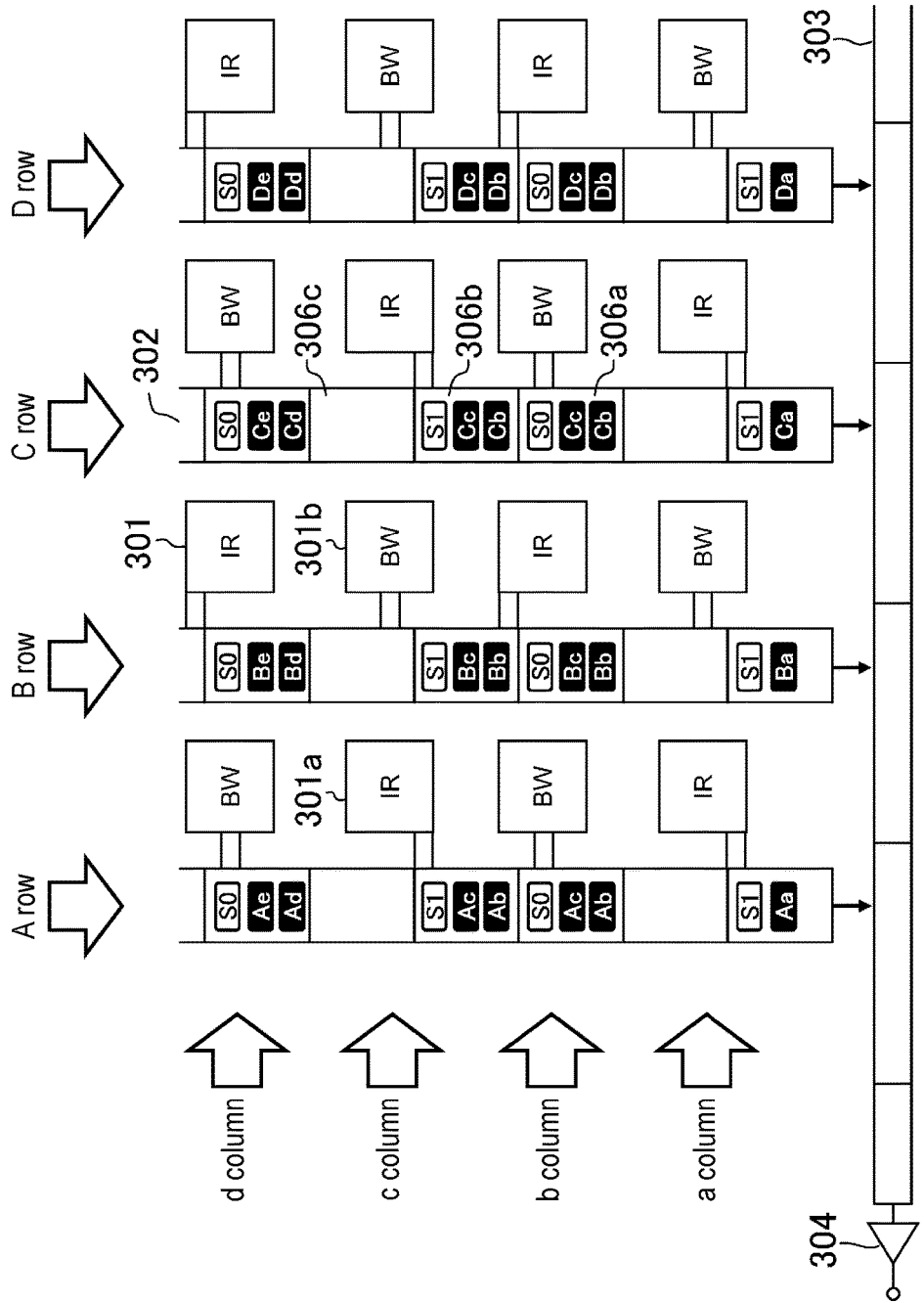
FIG. 12D is a plan view illustrating an operation of the solid-state imaging device illustrated in FIG. 11.

In subsequent second exposure period T2, signal charges S1 are read from first photoelectric conversion units 301a in columns a and c in the figure into vertical transfer units 302 in rows A and C in the figure, and from first photoelectric conversion units 301a in columns b and d in the figure into vertical transfer units 302 in rows B and D in the figure, and accumulated in corresponding vertical transfer units 302 as illustrated in FIG. 12D. In this case, dark currents may be generated when a reading pulse is applied to reading electrodes 305a and reading electrodes 305b during reading operation. With regard to packet 306b, dark current Cc is generated and accumulated in packet 306b when signal charge S1 is read from photoelectric conversion unit 301 in column c in the figure into vertical transfer unit 302 in row C in the figure. Moreover, dark current Cb is generated when signal charge S1 is read from photoelectric conversion units 301 in column b in the figure in a state that reading electrodes 305a and reading electrodes 305b to which the reading pulse is applied are disposed in all rows. In this case, reading electrodes 305a and reading electrodes 305b are oppositely located in the up-down direction for each column, wherefore dark current Cb is generated and accumulated in packet 306b similarly to dark current Cc. The reading and accumulation operations during second exposure period T2 are repeated a fixed number of times.

Figure 12E:
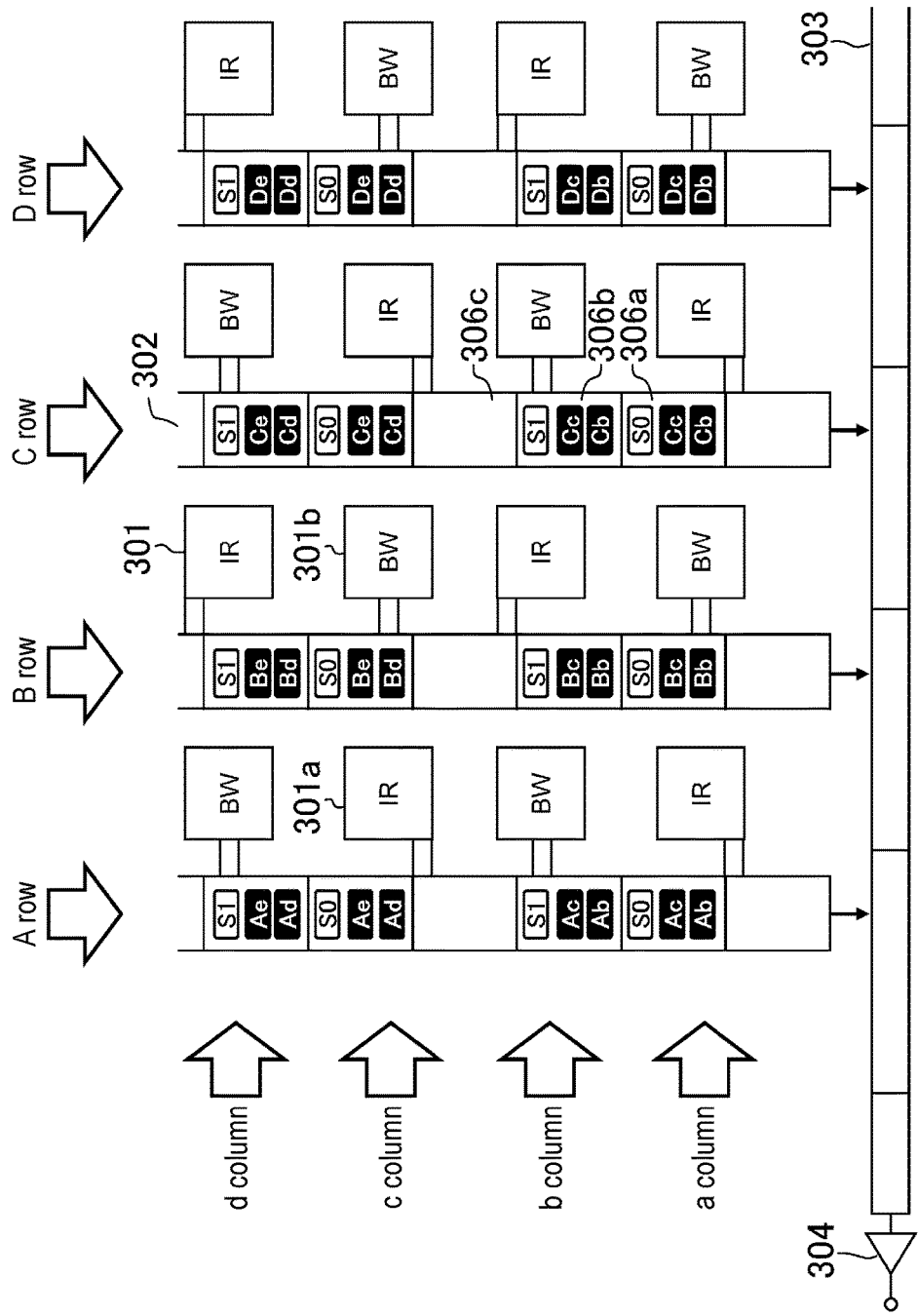
FIG. 12E is a plan view illustrating an operation of the solid-state imaging device illustrated in FIG. 11.

After completion of the reading and accumulation operations of second exposure period T2, packets in vertical transfer units 302 are transferred downward in the figure by one stage as illustrated in FIG. 12E.

Figure 12F:
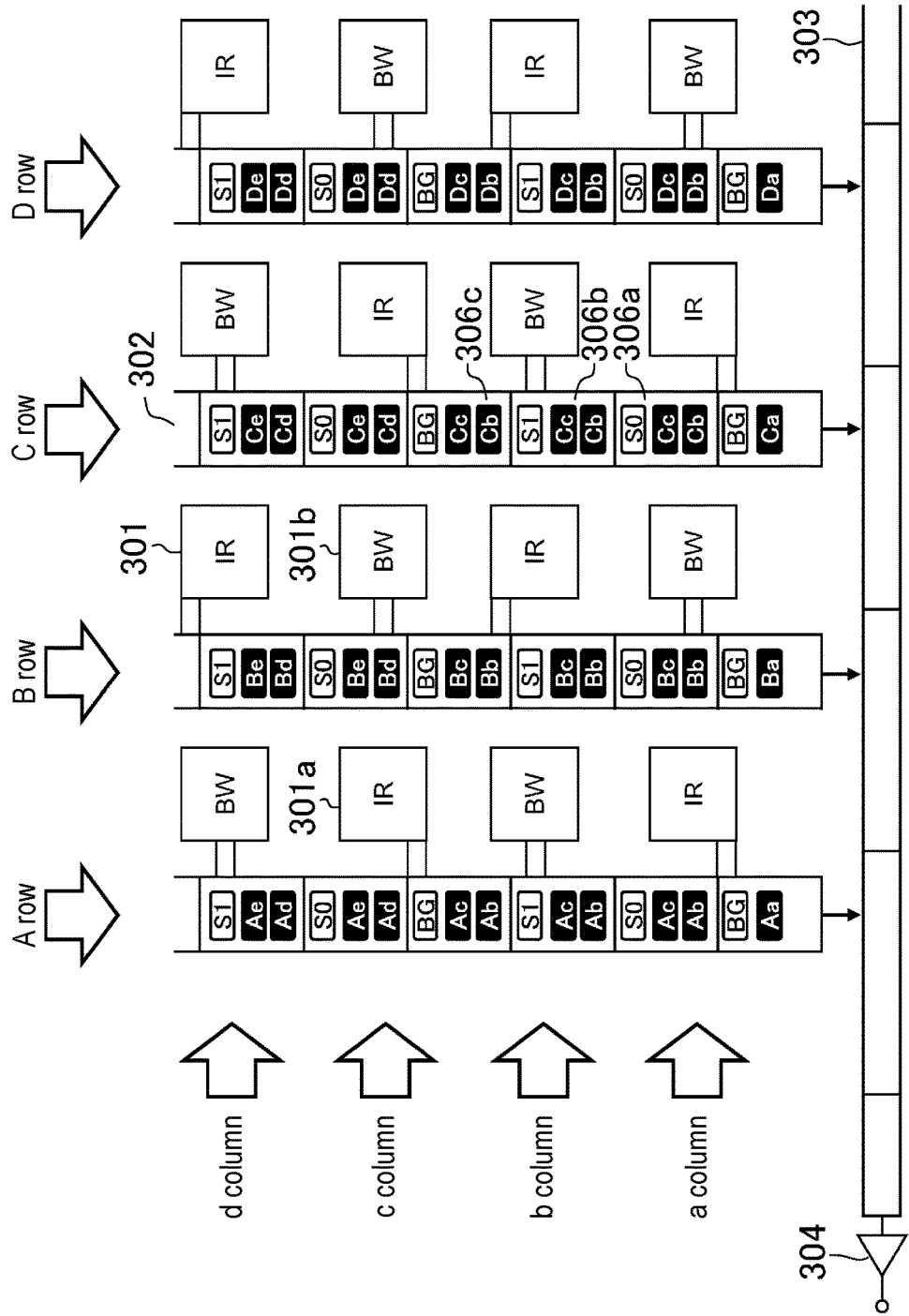
FIG. 12F is a plan view illustrating an operation of the solid-state imaging device illustrated in FIG. 11.
Figure 12G:
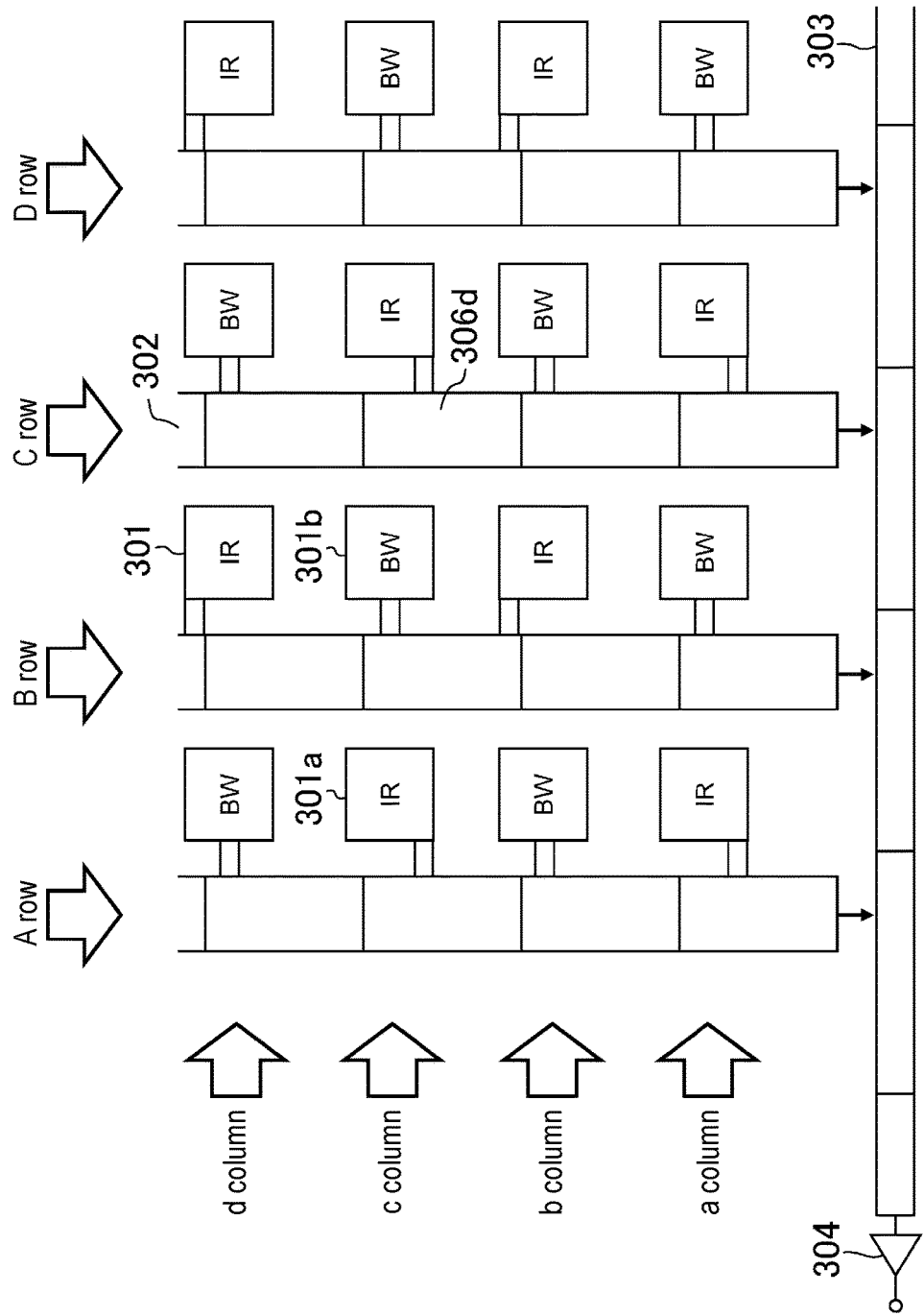
FIG. 12G is a plan view illustrating an operation of the solid-state imaging device illustrated in FIG. 11.

In subsequent third exposure period T3, signal charges BG are read from first photoelectric conversion units 301a in columns a and c in the figure into vertical transfer units 302 in rows A and C in the figure, and from first photoelectric conversion units 301a in columns b and d in the figure into vertical transfer units 302 in rows B and D in the figure, and accumulated in corresponding vertical transfer units 302 as illustrated in FIG. 12F. In this case, dark currents may be generated when a reading pulse is applied to reading electrodes 305a and reading electrodes 305b during reading operation. With regard to packet 306c, dark current Cc is generated and accumulated in packet 306c when signal charge BG is read from photoelectric conversion unit 301 in column c in the figure into vertical transfer unit 302 in row C in the figure. Moreover, dark current Cb is generated when signal charge BG is read from photoelectric conversion units 301 in column b in the figure in a state that reading electrodes 305a and reading electrodes 305b to which the reading pulse is applied are disposed in all rows. In this case, reading electrodes 305a and reading electrodes 305b are oppositely located in the up-down direction for each column, wherefore dark current Cb is generated and accumulated in packet 306c similarly to dark current Cc. The reading and accumulation operations during third exposure period T3 are repeated a fixed number of times.

Thereafter, packets of vertical transfer units 302 are transferred upward in the figure by two stages. After the transfer, a plurality of sets of the operations illustrated in FIGS. 12B to 12F are performed. Then, signal charges are transferred from vertical transfer units 302 to horizontal transfer unit 303 stage by stage, and sequentially transferred and output from horizontal transfer unit 303 to charge detector 304 to end the first frame within a first frame scanning period.

In this case, sources generating dark currents contained in signal charges accumulated in packets 306a to 306c in FIG. 12F are unified into an identical source similarly to the solid-state imaging device according to the first exemplary embodiment.

Subsequently, a packet configuration of the first frame is changed such that two packets 306d are provided for two photoelectric conversion units 301 prior to the exposure period of the second frame as illustrated in FIG. 12G.

In the exposure period of the second frame, a reading pulse is applied to reading electrodes 305c and reading electrodes 305d to read signal charges BW exposed during signal transfer of the first frame from second photoelectric conversion units 301b in columns a and c in the figure into vertical transfer units 302 in rows B and D in the figure, and from second photoelectric conversion units 301b in columns b and d in the figure into vertical transfer units 302 in rows A and C in the figure, and accumulate read signal charges BW in corresponding vertical transfer units 302 as illustrated in FIG. 12H. In this case, the reading pulse for reading signal charges of the second frame is sufficiently shorter than the reading pulse of the first frame, wherefore dark currents generated by reading are sufficiently small. Accordingly, no dark current of the second frame is shown in the figure.

Thereafter, signal charges BW are transferred from vertical transfer units 302 to horizontal transfer unit 303 for every two stages, and then sequentially transferred and output from horizontal transfer unit 303 to charge detector 304 to end the second frame. Levels of signal charges BW are determined based on brightness of the subject, wherefore formation of a visible image is allowed based on signal charges BW.

According to the solid-state imaging device in the third exemplary embodiment described above, the half of photoelectric conversion units 301 are constituted of first photoelectric conversion units 301a provided with IR filters for shielding visible light, while the remaining half are constituted of second photoelectric conversion units 301b provided with BW filters for shielding infrared light. Respective photoelectric conversion units 301 are disposed in a checkered pattern. According to this structure, sources and signal levels of dark currents contained in signal charges S0, S1, and BG are similarly unified and equalized. In this case, capture of a visible image is allowed unlike the solid-state imaging device in the first exemplary embodiment. Accordingly, a distance measuring camera including the solid-state imaging device in this embodiment has wider applicability such as for use of cutout of a particular subject (background separation), and creation of three-dimensional avatars.

Fourth Exemplary Embodiment

Figure 13:
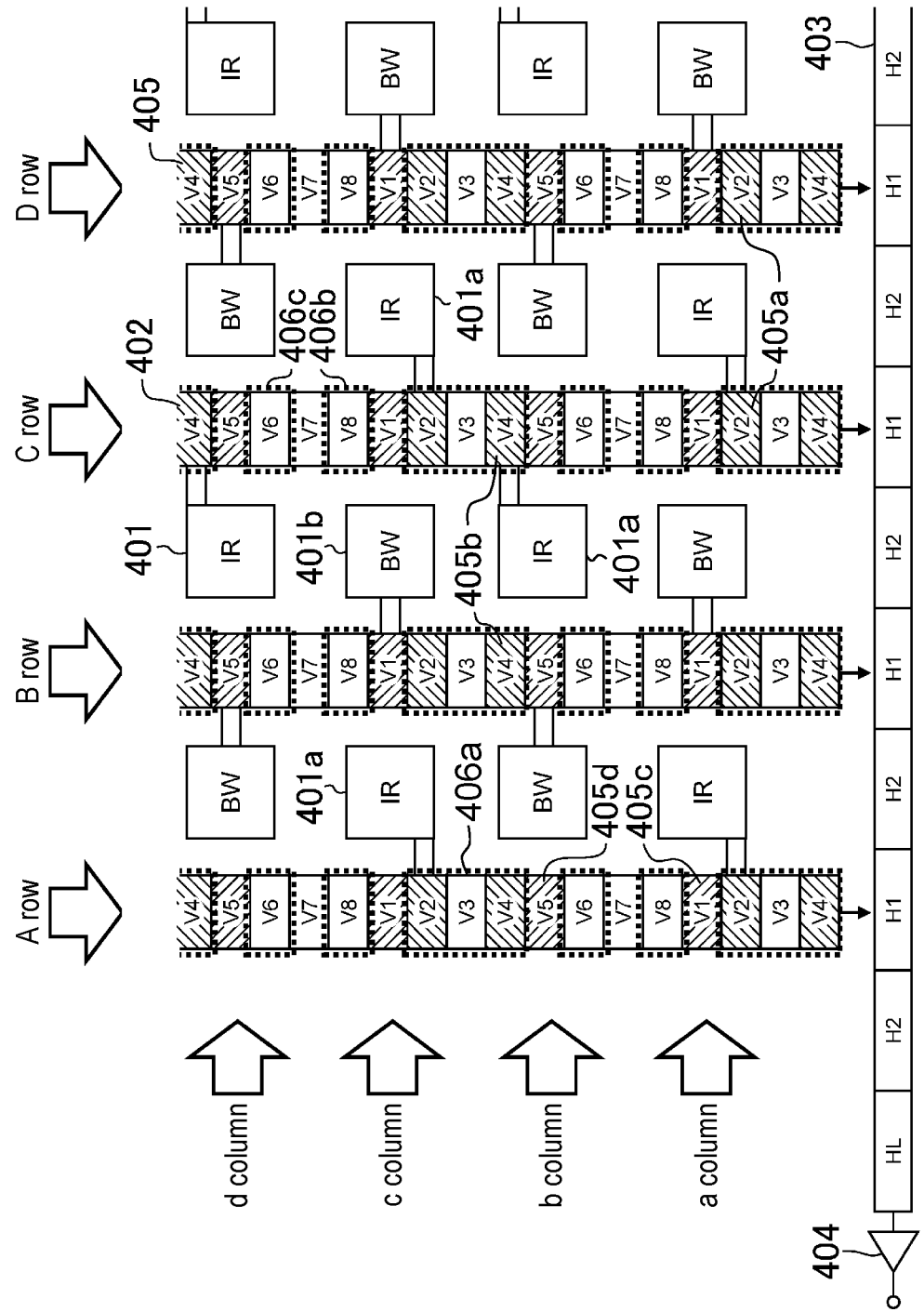
FIG. 13 is a plan view illustrating a configuration of a solid-state imaging device according to a fourth exemplary embodiment.

FIG. 13 is a view illustrating a configuration of a solid-state imaging device according to the fourth exemplary embodiment. Only four pixels in the vertical direction and four pixels in the horizontal direction are shown in FIG. 13 for simplifying the figure.

As illustrated in FIG. 13, the solid-state imaging device in this exemplary embodiment includes a plurality of photoelectric conversion units 401 disposed in a matrix form on a semiconductor substrate and converting incident light into signal charges, vertical transfer units 402 provided in correspondence with photoelectric conversion units 401 and transferring signal charges read from photoelectric conversion units 401 in a column direction, horizontal transfer unit 403 transferring signal charges received from vertical transfer units 402 in a row direction, and charge detector 404 outputting signal charges received from horizontal transfer unit 403. The solid-state imaging device further includes reading electrodes 405a to 405d. Each of reading electrodes 405a to 405d is provided for each of photoelectric conversion units 401 to read signal charges from photoelectric conversion units 401 into vertical transfer units 402 for each row. In FIG. 13, positions of reading electrodes 405a and 405b are hatched, while positions of reading electrodes 405c and 405d are hatched in a manner different from the hatches of the positions of reading electrodes 405a and 405b.

A half of photoelectric conversion units 401 are constituted of first photoelectric conversion units 401a provided with IR filters for shielding visible light, while a remaining half of photoelectric conversion units 401 are constituted of second photoelectric conversion units 401b provided with BW filters for shielding infrared light. First and second photoelectric conversion units 401a and 402b are disposed in a checkered pattern. Accordingly, capture of both a visible image and a distance image is realizable.

Moreover, first reading electrodes 405a and second reading electrodes 405b with respect to first photoelectric conversion units 401a are oppositely located in the up-down direction for each column, while positions of third reading electrodes 405c and fourth reading electrodes 405d with respect to second photoelectric conversion units 401b are uniform for each column. More specifically, as hatched in the figure, reading electrodes 405a and 405b associated with first photoelectric conversion units 401a in each column are disposed in a line in the column direction, and shifted to the upper side or the lower side in the row direction with respect to centers of corresponding photoelectric conversion units 401a alternately for each column. On the other hand, reading electrodes 405c and 405d associated with second photoelectric conversion units 401b in each column are disposed in a line in the column direction, and aligned with centers of corresponding photoelectric conversion units 401b in the row direction.

The solid-state imaging device according to the fourth exemplary embodiment is different from the solid-state imaging device according to the third exemplary embodiment in positions of reading electrodes 405. However, an object for providing a structure of the solid-state imaging device capable of unifying sources of dark currents contained in a plurality of signal charges read from one photoelectric conversion unit into an identical source is similar to the corresponding object of the solid-state imaging device in the third exemplary embodiment. Differences from the third exemplary embodiment are chiefly described herein. Identical points are not repeatedly explained.

According to the solid-state imaging device illustrated in FIG. 13, first reading electrodes 405a and second reading electrodes 405b have a structure capable of simultaneously reading signal charges from each of photoelectric conversion units 401a adjacent to each other in a diagonal direction with corresponding vertical transfer unit 402 interposed between adjoining photoelectric conversion units 401a, and adding the read signal charges, unlike the solid-state imaging device illustrated in FIG. 11. Accordingly, capture of a visible image and a distance image is achievable by one frame.

Figure 14A:
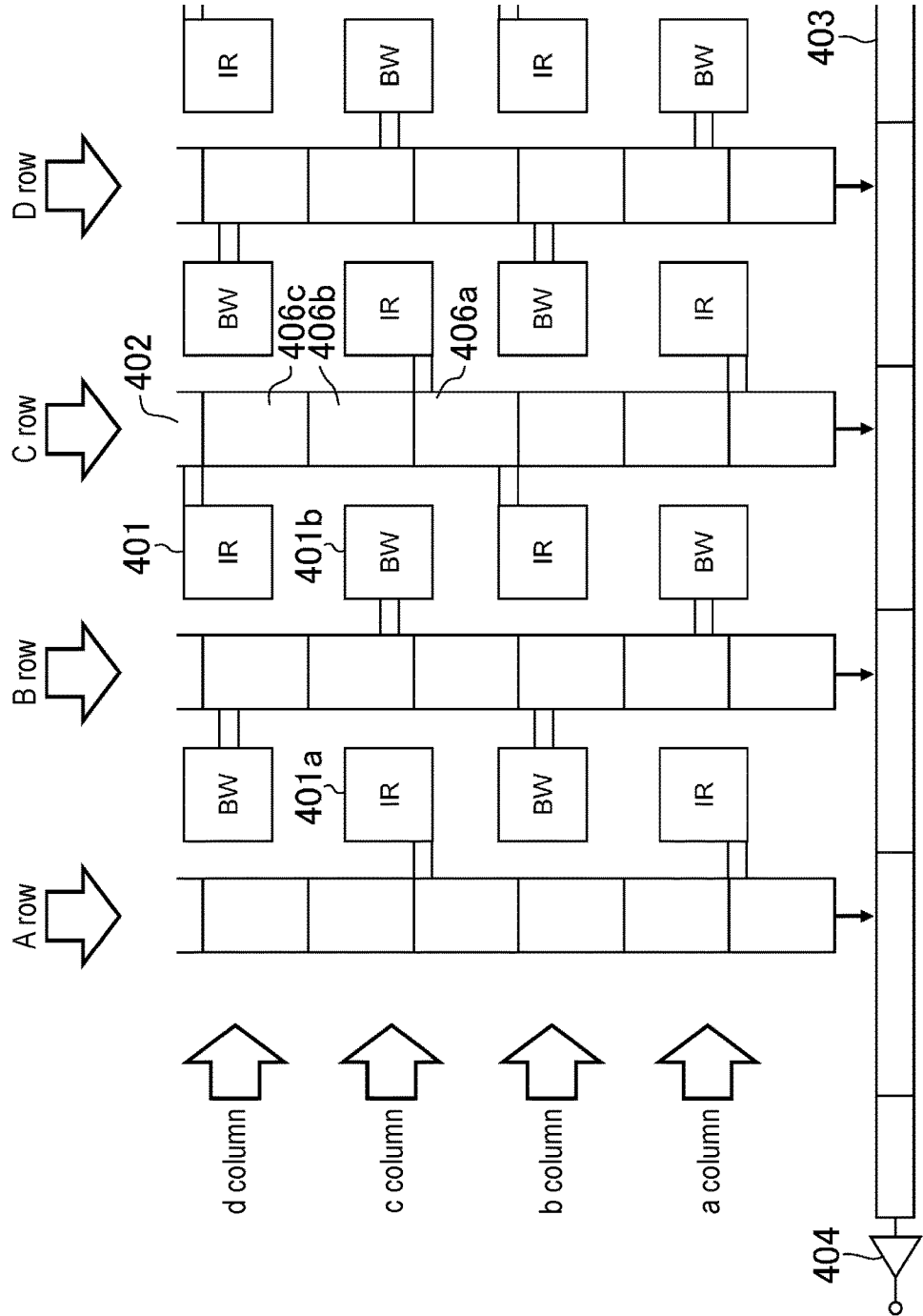
FIG. 14A is a plan view illustrating an operation of the solid-state imaging device illustrated in FIG. 13.

FIGS. 14A to 14G are plan views illustrating operations of the solid-state imaging device illustrated in FIG. 13. FIG. 14A illustrates an operation of the solid-state imaging device prior to exposure, while FIGS. 14B to 14F illustrate operations of the solid-state imaging device during respective exposure periods.

Initially, signal charges are not accumulated in corresponding packets 406a to 406c prior to the exposure periods as illustrated in FIG. 14A.

Figure 14B:
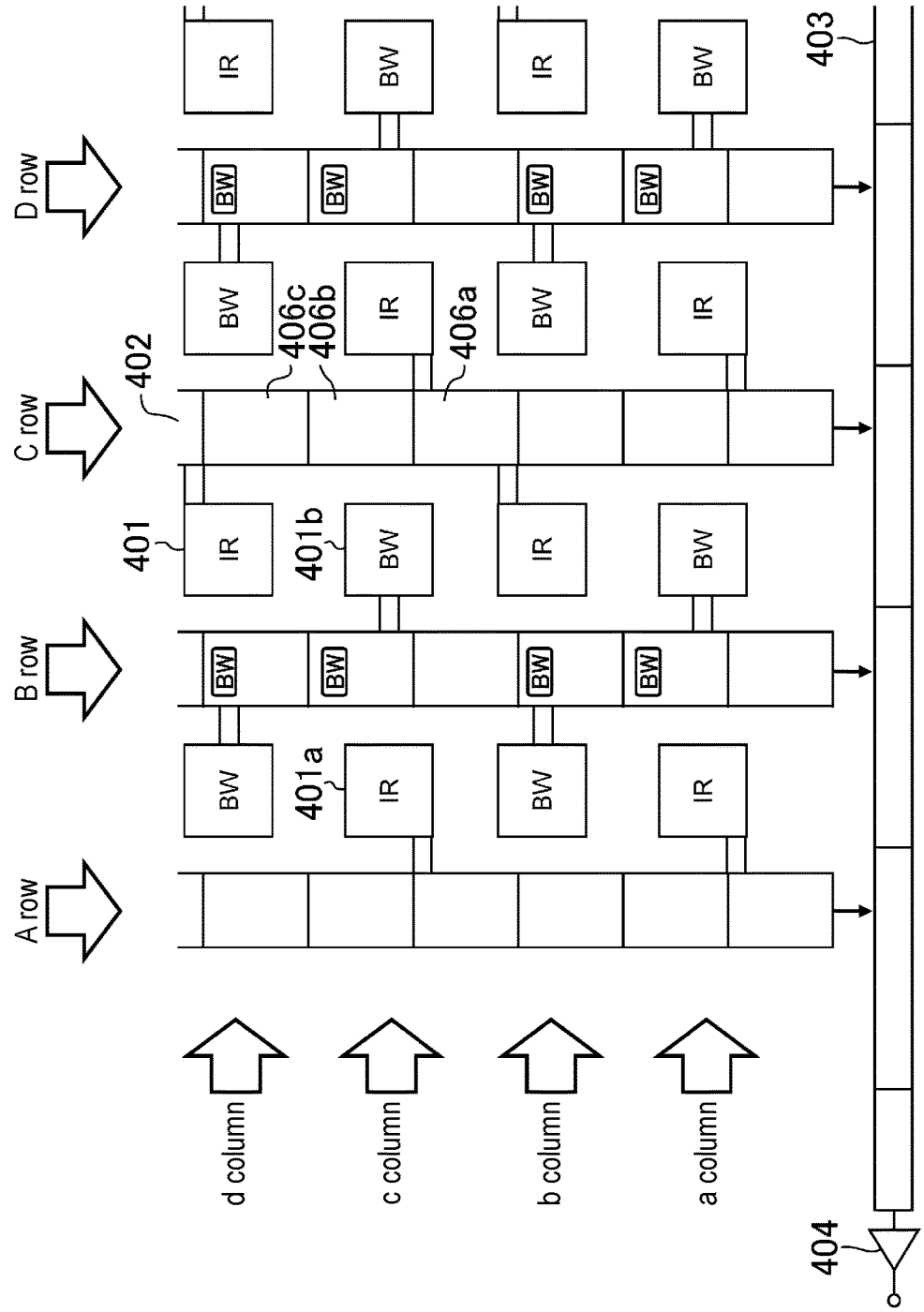
FIG. 14B is a plan view illustrating an operation of the solid-state imaging device illustrated in FIG. 13.

In the respective exposure periods, a reading pulse is initially applied to reading electrode 405c and reading electrode 405d as illustrated in FIG. 14B. Signal charges BW exposed during signal transfer of a previous frame are read from second photoelectric conversion units 401b into vertical transfer units 402 in rows B and D in the figure, and accumulated in vertical transfer units 402 in rows B and D.

Figure 14C:
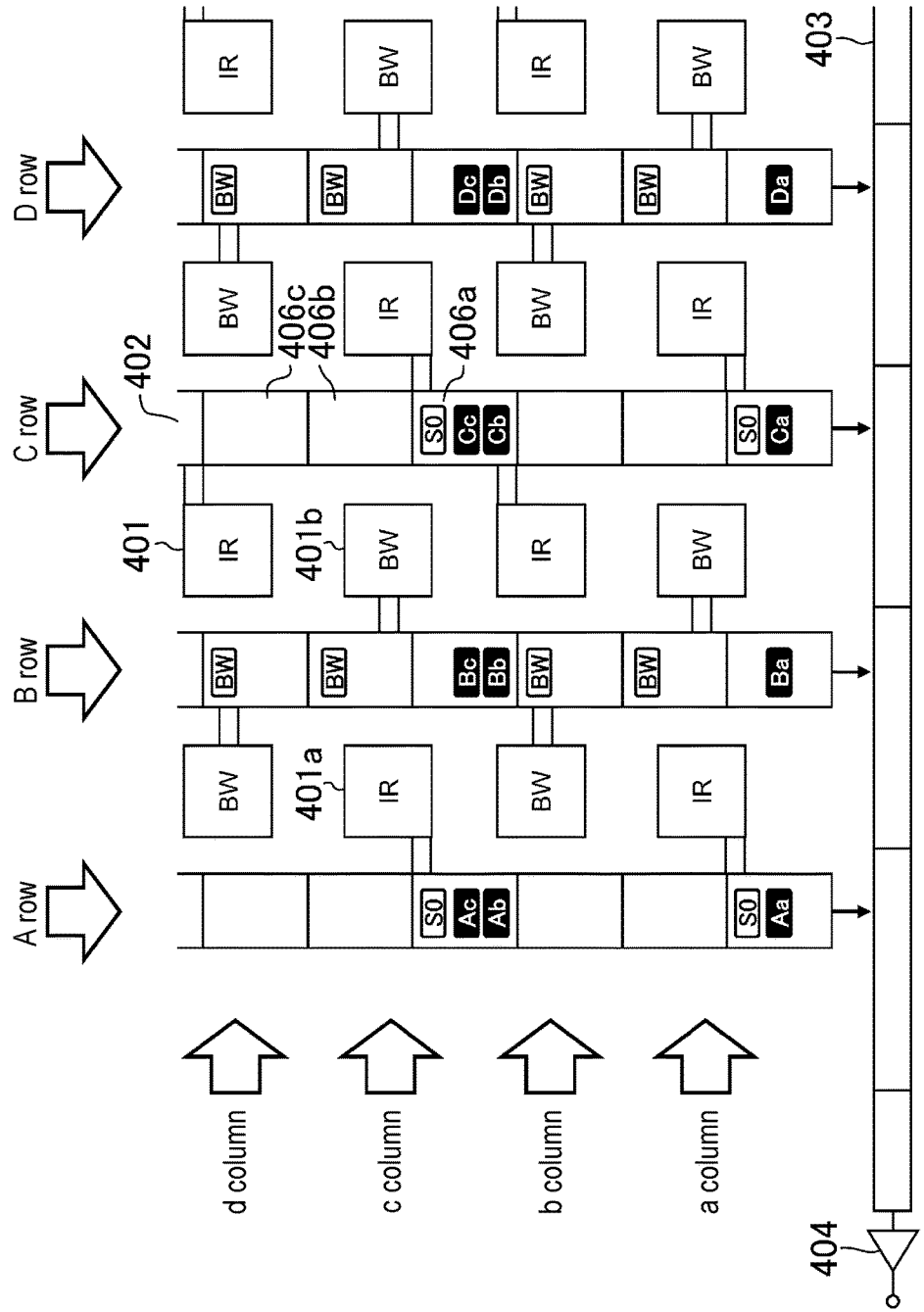
FIG. 14C is a plan view illustrating an operation of the solid-state imaging device illustrated in FIG. 13.

In subsequent first exposure period T1 of the exposure periods, signal charges S0 are read from first photoelectric conversion units 401a into vertical transfer units 402 in rows A and C in the figure, and accumulated in corresponding vertical transfer units 402 as illustrated in FIG. 14C. In this case, dark currents may be generated when a reading pulse is applied to reading electrodes 405a and reading electrodes 405b during reading operation. With regard to packet 406a, dark current Cc is generated and accumulated in packet 406a when signal charge S0 is read from photoelectric conversion unit 401 in column c in the figure into vertical transfer unit 402 in row C in the figure. Moreover, dark current Cb is generated when signal charge S0 is read from photoelectric conversion units 401 in column b in the figure in a state that reading electrodes 405a and reading electrodes 405b to which the reading pulse is applied are disposed in all rows. In this case, reading electrodes 405a and reading electrodes 405b are oppositely located in the up-down direction for each column, wherefore dark current Cb is generated and accumulated in packet 406a similarly to dark current Cc. Reading and accumulation operations in this manner during first exposure period T1 are repeated a fixed number of times.

Figure 14D:
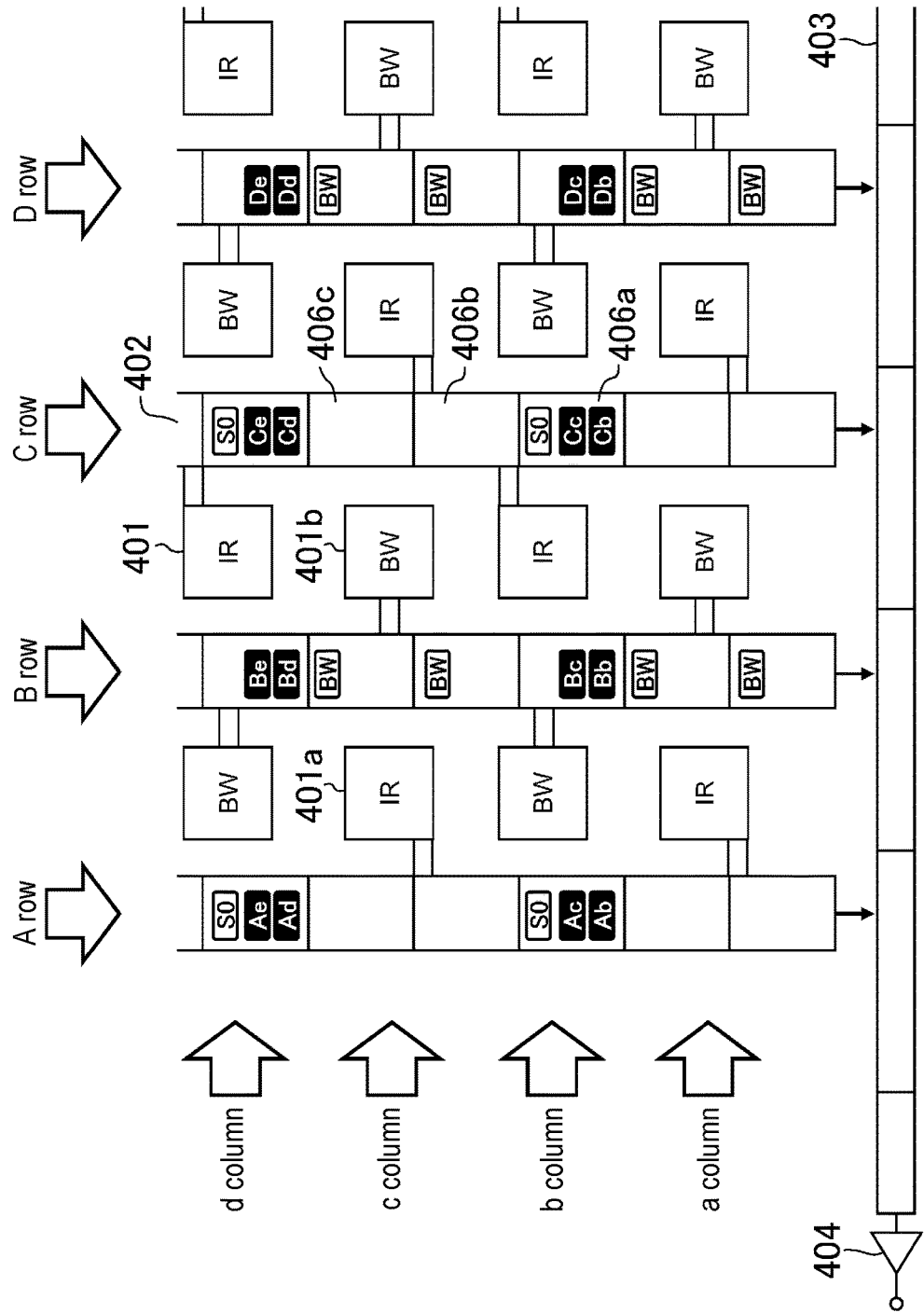
FIG. 14D is a plan view illustrating an operation of the solid-state imaging device illustrated in FIG. 13.

After completion of the reading and accumulation operations of first exposure period T1, packets in vertical transfer units 402 are transferred downward in the figure by one stage as illustrated in FIG. 14D.

In subsequent second exposure period T2, signal charges S1 are read from first photoelectric conversion units 401a into vertical transfer units 402 in rows A and C in the figure, and accumulated in corresponding vertical transfer units 402 as illustrated in FIG. 14E. In this case, dark currents may be generated when a reading pulse is applied to reading electrodes 405a and reading electrodes 405b during reading operation. With regard to packet 406b, dark current Cc is generated and accumulated in packet 406b when signal charge S1 is read from photoelectric conversion unit 401 in column c in the figure into vertical transfer unit 402 in row C in the figure. Moreover, dark current Cb is generated when signal charge S1 is read from photoelectric conversion units 401 in column b in the figure in a state that reading electrodes 405b to which the reading pulse is applied are disposed in all rows. In this case, reading electrodes 405a and reading electrodes 405a and reading electrodes 405b are oppositely located in the up-down direction for each column, wherefore dark current Cb is generated and accumulated in packet 406b similarly to dark current Cc. The reading and accumulation operations during second exposure period T2 are repeated a fixed number of times.

Figure 14F:
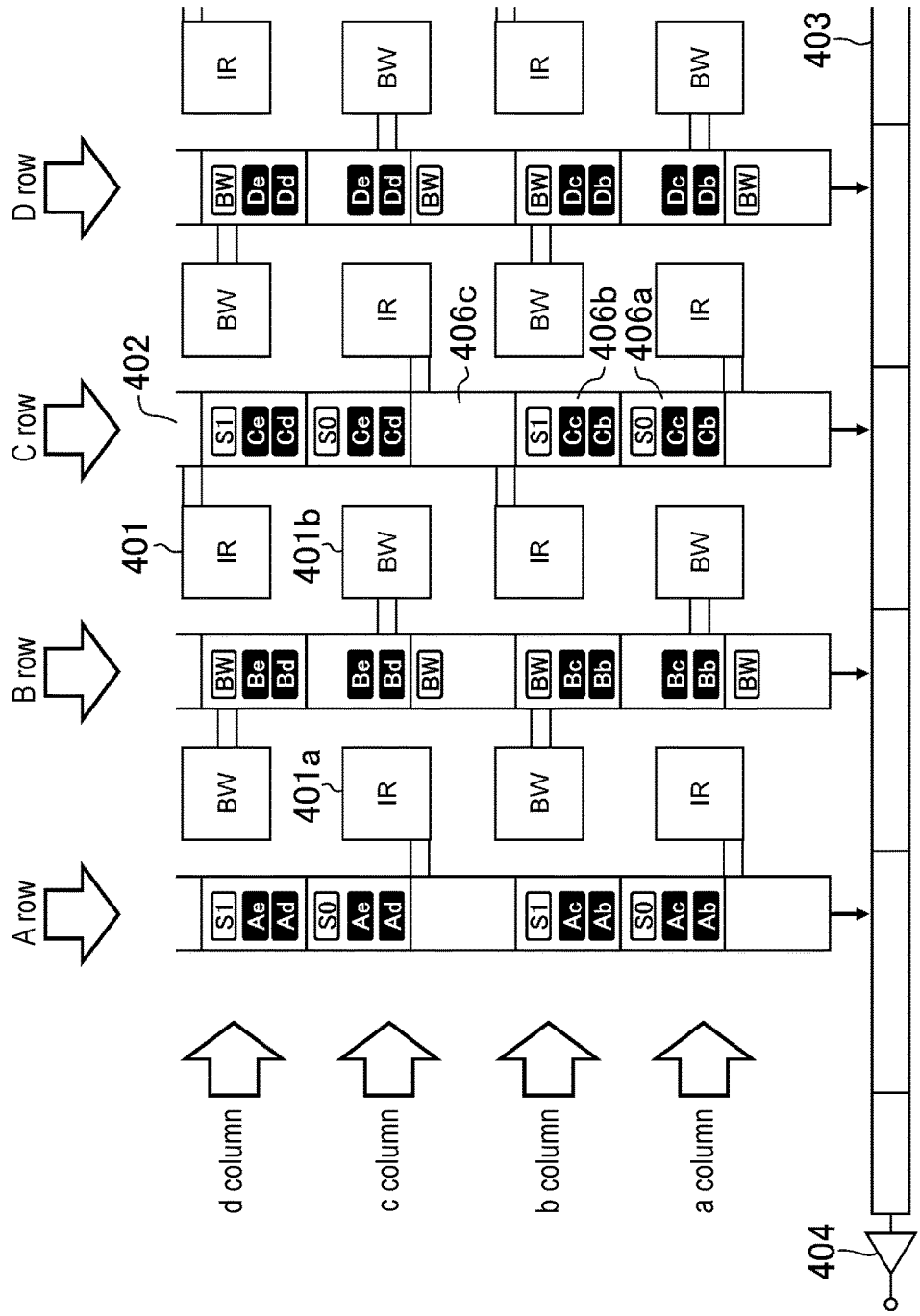
FIG. 14F is a plan view illustrating an operation of the solid-state imaging device illustrated in FIG. 13.

After completion of the reading and accumulation operations of second exposure period T2, packets in vertical transfer units 402 are transferred downward in the figure by one stage as illustrated in FIG. 14F.

Figure 14G:
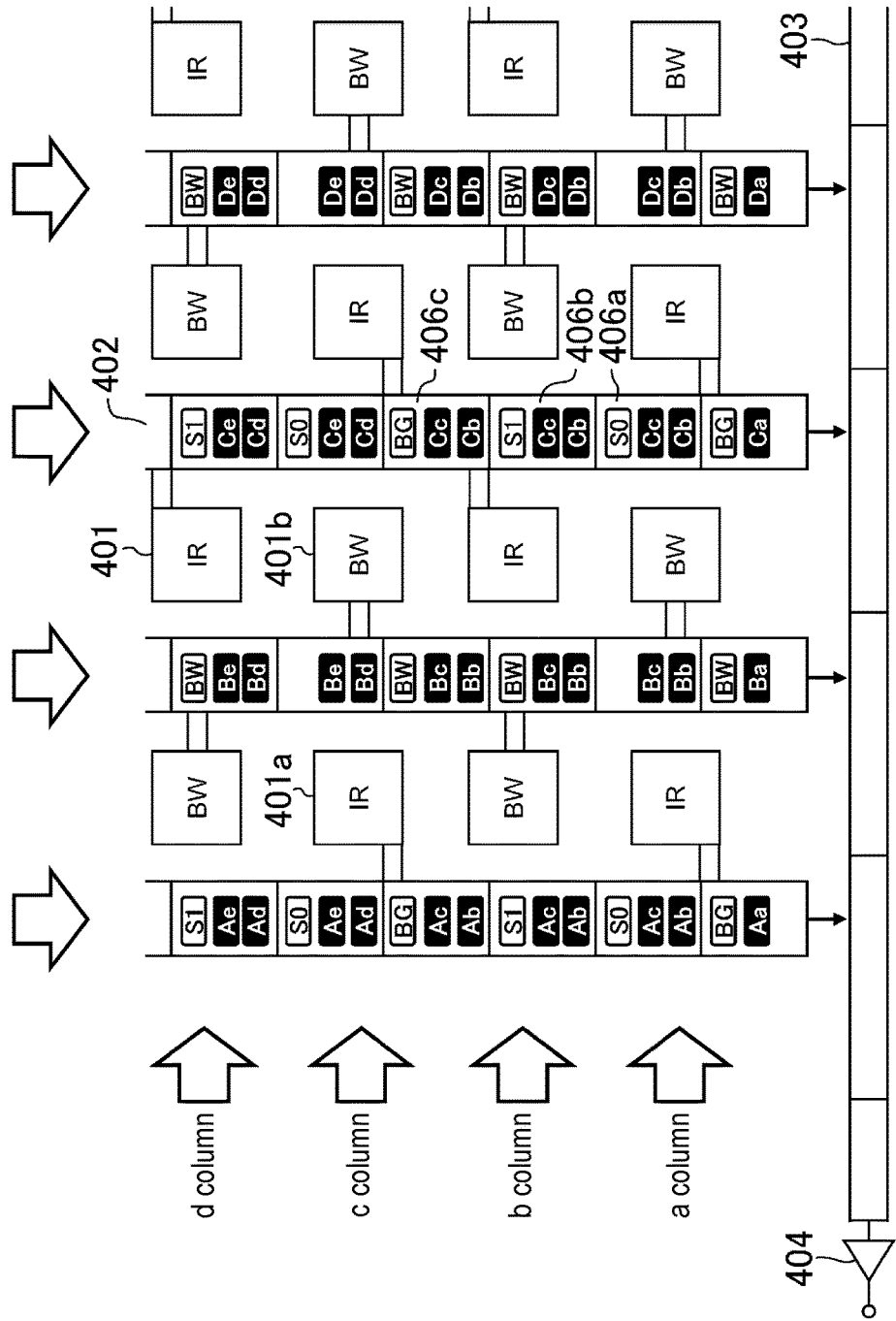
FIG. 14G is a plan view illustrating an operation of the solid-state imaging device illustrated in FIG. 13.

In subsequent third exposure period T3, signal charges BG are read from first photoelectric conversion units 401a into vertical transfer units 402 in rows A and C in the figure, and accumulated in corresponding vertical transfer units 402 as illustrated in FIG. 14G. In this case, dark currents may be generated when a reading pulse is applied to reading electrodes 405a and reading electrodes 405b during reading operation. With regard to packet 406c, dark current Cc is generated and accumulated in packet 406c when signal charge BG is read from photoelectric conversion unit 401 in column c in the figure into vertical transfer unit 402 in row C in the figure. Moreover, dark current Cb is generated when signal charge BG is read from photoelectric conversion units 401 in column b in the figure in a state that reading electrodes 405a and reading electrodes 405b to which the reading pulse is applied are disposed in all rows. In this case, reading electrodes 405a and reading electrodes 405b are oppositely located in the up-down direction for each column, wherefore dark current Cb is generated and accumulated in packet 406c similarly to dark current Cc. The reading and accumulation operations during third exposure period T3 are repeated a fixed number of times.

Thereafter, packets of vertical transfer units 402 are transferred upward in the figure by two stages. After the transfer, a plurality of sets of the operations illustrated in FIGS. 14C to 12G are performed. Then, signal charges are transferred from vertical transfer units 402 to horizontal transfer unit 403 stage by stage, and subsequently transferred and output from horizontal transfer unit 403 to charge detector 404.

In this case, sources of dark currents contained in signal charges S0, S1, and BG accumulated in packets 406a to 406c in FIG. 14G are unified into an identical source similarly to the solid-state imaging device according to the first embodiment. In addition, for calculation of a difference of signal charge BW, sources of dark currents contained in signal charge BW are similarly unified into an identical source.

The solid-state imaging device according to the fourth exemplary embodiment changes the positions of reading electrodes 405, and adds, on vertical transfer units 402, signal charges of photoelectric conversion units 401 adjacent to each other in the diagonal direction with corresponding vertical transfer units 402 interposed between adjoining photoelectric conversion units 401. According to this structure, sources and signal levels of dark currents contained in signal charges S0, S1, and BG can be similarly unified and equalized. Accordingly, a visible image and a distance image can be output from an identical frame unlike the solid-state imaging device in the third embodiment, wherefore a frame rate improves.

The respective exemplary embodiments are presented only by way of example. The present disclosure is not limited to the exemplary embodiments described herein.

For example, the numbers of electrodes provided for the vertical transfer units and the horizontal transfer units are not limited to the specific numbers in the examples presented herein, but may be changed to other appropriate numbers.

Moreover, the numbers of the packets provided for the vertical transfer units and the horizontal transfer units are not limited to the specific numbers in the examples presented herein, but may be changed to other appropriate numbers.

Furthermore, wavelengths shielded by the filters provided on the photoelectric conversion units are not limited to the specific wavelengths in the specific examples presented herein, but may be changed to other appropriate wavelengths.

While the imaging devices according to the exemplary embodiments have been discussed, the present disclosure is not limited to the respective exemplary embodiments presented herein. Modes including various types of modifications occurring to those skilled in the art, and modes combining respective constituent elements of different exemplary embodiments are also included without departing from the subject matters of the present disclosure.

INDUSTRIAL APPLICABILITY

An imaging device according to the present disclosure is capable of improving horizontal and vertical resolutions without lowering distance measuring accuracy, and therefore is a useful imaging device which accurately captures a distance image of a small subject or a subject located far away. For example, the imaging device according to the present disclosure is suitable for an imaging device including an application for a distance measuring camera, such as a smartphone to which a gesture is input by using a fingertip, and a game machine controlled by operations of entire bodies of a plurality of persons.

REFERENCE MARKS IN THE DRAWINGS 1, 11 subject
2 background light source
3, 13 infrared light source
4 optical lens
5, 15 solid-state imaging device
12 background light source
14 optical lens
16 controller
17 signal processor
101, 201, 301, 301a, 301b, 401, 401a, 401b, 1001 photoelectric conversion unit
102, 202, 302, 402, 1002 vertical transfer unit
103, 203, 303, 403, 1003 horizontal transfer unit
104, 204, 304, 404, 1004 charge detector
105a, 105b, 205a, 205b, 305a, 305b, 305c, 305d, 405, 405a, 405b, 405c, 405d, 1005, 1005a, 1005b reading electrode
106a, 106b, 106c, 206a, 306a, 306b, 306c, 306d, 406a, 406b, 406c, 1006a, 1006b, 1006c packet
107, 1007 channel stop area
105, 205 vertical transfer electrode

The invention claimed is:
1. An imaging device comprising:
a solid-state imaging device that includes a plurality of pixels disposed in a matrix formed on a substrate and receives incident light containing infrared light,
wherein each of the plurality of pixels includes at least one of first pixels that receives incident light containing infrared light,
each of the first pixels includes a photoelectric conversion unit that converts the incident infrared light into a signal charge, a first reading electrode that reads the signal charge from the photoelectric conversion unit and a second reading electrode that does not read the signal charge,
the first reading electrode and the second reading electrode constitute a vertical transfer unit,
a plurality of the first reading electrodes alternately disposed for each row and alternately disposed for each column such that the plurality of the first reading electrodes are located in a checkered pattern,
a packet comprises the first reading electrode and the second reading electrode, and
the vertical transfer unit charges the signal charge in the packet when the vertical transfer unit reads the signal charge from the photoelectric conversion unit, and
wherein in one frame scanning period, the vertical transfer unit reads first signal charges from the first pixels during a first exposure period, reads second signal charges from the first pixels during a second exposure period, reads third signal charges from the first pixels during a third exposure period, and outputs the first to third signal charges, and
wherein the first to third signal charges are accumulated under electrodes of an identical phase for each row.

2. The imaging device according to claim 1, wherein the first reading electrodes are disposed in a line in a column direction in each of the columns, and are shifted to an upper side position or a lower side position in a row direction with respect to centers of the corresponding photoelectric conversion units alternately for each column.

3. The imaging device according to claim 1, wherein the plurality of pixels include a first pixel and a second pixel being adjacent to the first pixel horizontally, signal charges of the first and second pixels disposed adjacent to each other in the column direction are added on the vertical transfer unit.

4. The imaging device according to claim 1, wherein signal charges of the first pixels adjoining in a diagonal direction are added on the vertical transfer unit.

5. The imaging device according to claim 1, wherein each of the plurality of pixels includes a filter that shields infrared light.

6. The imaging device according to claim 5, wherein the vertical transfer unit is constituted of a plurality of electrodes per two pixels, and configured to accumulate at least three types of signal charges per two pixels,
in a first frame scanning period, the vertical transfer unit reads first signal charges from the first pixels during a first exposure period, reads second signal charges from the first pixels during a second exposure period, reads third signal charges from the first pixels during a third exposure period, and outputs the first to third signal charges, and in a second frame scanning period, the vertical transfer unit reads fourth signal charges from the second pixels during a fourth exposure period, and outputs the fourth signal charges.

7. The imaging device according to claim 5, wherein
the vertical transfer unit is constituted of a plurality of electrodes per two pixels, and configured to accumulate at least three types of signal charges per two pixels, and
in one frame scanning period, the vertical transfer unit reads first signal charges from the first pixels during a first exposure period, reads second signal charges from the first pixels during a second exposure period, reads third signal charges from the first pixels during a third exposure period, reads fourth signal charges from the second pixels during a fourth exposure period, and outputs the first to fourth signal charges.

8. An imaging device comprising:
a solid-state imaging device that includes a plurality of pixels disposed in a matrix formed on a substrate and receives incident light containing infrared light,
wherein each of the plurality of pixels includes at least one of first pixels that receives incident light containing infrared light,
each of the first pixels includes a photoelectric conversion unit that converts the incident infrared light into a signal charge, a first reading electrode that reads the signal charge from the photoelectric conversion unit and a second reading electrode that does not read the signal charge,
the first reading electrode and the second reading electrode constitute a vertical transfer unit,
a plurality of the first reading electrodes alternately disposed for each row and alternately disposed for each column such that the plurality of the first reading electrodes are located in a checkered pattern,
a packet comprises the first reading electrode and the second reading electrode, and
the vertical transfer unit charges the signal charge in the packet when the vertical transfer unit reads the signal charge from the photoelectric conversion unit, and
wherein each of the plurality of pixels includes a filter that shields infrared light, and
wherein the vertical transfer unit is constituted of a plurality of electrodes per two pixels, and configured to accumulate at least three types of signal charges per two pixels,
in a first frame scanning period, the vertical transfer unit reads first signal charges from the first pixels during a first exposure period, reads second signal charges from the first pixels during a second exposure period, reads third signal charges from the first pixels during a third exposure period, and outputs the first to third signal charges, and
in a second frame scanning period, the vertical transfer unit reads fourth signal charges from the second pixels during a fourth exposure period, and outputs the fourth signal charges, and
wherein the first to third signal charges read from the first pixels are accumulated under electrodes of an identical phase for each row.

9. An imaging device comprising:
a solid-state imaging device that includes a plurality of pixels disposed in a matrix formed on a substrate and receives incident light containing infrared light,
wherein each of the plurality of pixels includes at least one of first pixels that receives incident light containing infrared light,
each of the first pixels includes a photoelectric conversion unit that converts the incident infrared light into a signal charge, a first reading electrode that reads the signal charge from the photoelectric conversion unit and a second reading electrode that does not read the signal charge,
the first reading electrode and the second reading electrode constitute a vertical transfer unit,
a plurality of the first reading electrodes alternately disposed for each row and alternately disposed for each column such that the plurality of the first reading electrodes are located in a checkered pattern,
a packet comprises the first reading electrode and the second reading electrode, and
the vertical transfer unit charges the signal charge in the packet when the vertical transfer unit reads the signal charge from the photoelectric conversion unit, and
wherein in one frame scanning period, the vertical transfer unit reads first signal charges from the first pixels during a first exposure period, reads second signal charges from the first pixels during a second exposure period, reads third signal charges from the first pixels during a third exposure period, and outputs the first to third signal charges, and
an infrared light source that applies the infrared light, and
wherein when the imaging device functions as a time-of-flight distance measuring sensor,
in the first exposure period, the imaging device emits and applies pulsed infrared light to a subject, and reads received reflected light of the infrared light from the photoelectric conversion units of the first and second pixels to generate the first signal charges,
in the second exposure period, the imaging device emits and applies pulsed infrared light to the subject, and reads received reflected light of the infrared light from the photoelectric conversion units of the first and second pixels to generate the second signal charges,
in the third exposure period, the imaging device captures an image without applying the infrared light, and reads background light from the photoelectric conversion units of the first and second pixels to generate the third signal charges, and
the imaging device calculates a distance to the subject based on differences and ratios between the first signal charges, the second signal charges, and the third signal charges to form a distance image.

10. An imaging device comprising:
a solid-state imaging device that includes a plurality of pixels disposed in a matrix formed on a substrate and receives incident light containing infrared light,
wherein each of the plurality of pixels includes at least one of first pixels that receives incident light containing infrared light,
each of the first pixels includes a photoelectric conversion unit that converts the incident infrared light into a signal charge, a first reading electrode that reads the signal charge from the photoelectric conversion unit and a second reading electrode that does not read the signal charge,
the first reading electrode and the second reading electrode constitute a vertical transfer unit,
a plurality of the first reading electrodes alternately disposed for each row and alternately disposed for each column such that the plurality of the first reading electrodes are located in a checkered pattern,
a packet comprises the first reading electrode and the second reading electrode, and the vertical transfer unit charges the signal charge in the packet when the vertical transfer unit reads the signal charge from the photoelectric conversion unit, and wherein each of the plurality of pixels includes a filter that shields infrared light, and wherein the vertical transfer unit is constituted of a plurality of electrodes per two pixels, and configured to accumulate at least three types of signal charges per two pixels, in a first frame scanning period, the vertical transfer unit reads first signal charges from the first pixels during a first exposure period, reads second signal charges from the first pixels during a second exposure period, reads third signal charges from the first pixels during a third exposure period, and outputs the first to third signal charges, in a second frame scanning period, the vertical transfer unit reads fourth signal charges from the second pixels during a fourth exposure period, and outputs the fourth signal charges, and an infrared light source that applies the infrared light, and wherein when the imaging device functions as a time-of-flight distance measuring sensor, in the first exposure period, the imaging device emits and applies pulsed infrared light to a subject, and reads received reflected light of the infrared light from the photoelectric conversion units of the first pixels to generate the first signal charges, in the second exposure period, the imaging device emits and applies pulsed infrared light to the subject, and reads received reflected light of the infrared light from the photoelectric conversion units of the first pixels to generate the second signal charges, in the third exposure period, the imaging device captures an image without applying the infrared light, and reads background light from the photoelectric conversion units of the first pixels to generate the third signal charges, in the fourth exposure period, the imaging device captures an image without applying the infrared light, and reads background light from the photoelectric conversion units of the second pixels to generate the fourth signal charges, and the imaging device calculates a distance to the subject based on differences and ratios between the first to third signal charges to form a distance image, and calculates brightness of the subject based on a level of the fourth signal charges to form a visible image.

* * * * *